(12) United States Patent
Gotoh et al.

(10) Patent No.: US 6,639,245 B2
(45) Date of Patent: Oct. 28, 2003

(54) ACTIVE MATRIX DISPLAY DEVICE HAVING HIGH INTENSITY AND HIGH PRECISION AND MANUFACTURING METHOD THEREOF

(75) Inventors: Masahito Gotoh, Fukuyama (JP); Tohru Ueda, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/120,981

(22) Filed: Apr. 11, 2002

(65) Prior Publication Data

US 2002/0149017 A1 Oct. 17, 2002

(30) Foreign Application Priority Data

Apr. 16, 2001 (JP) ........................ 2001-116917

(51) Int. Cl.$^7$ ............................................. H01L 29/786
(52) U.S. Cl. .............................. 257/72; 257/66; 257/75
(58) Field of Search ................................ 257/72, 66, 75

(56) References Cited

U.S. PATENT DOCUMENTS

| | | | | |
|---|---|---|---|---|
| 5,818,068 A | * | 10/1998 | Sasaki et al. | .................. 257/59 |
| 5,886,366 A | * | 3/1999 | Yamazaki et al. | ............. 257/59 |
| 6,034,748 A | * | 3/2000 | Furuta | .......................... 349/43 |
| 6,162,704 A | | 12/2000 | Yamazaki et al. | ........... 438/471 |

FOREIGN PATENT DOCUMENTS

| | | |
|---|---|---|
| JP | 06-244103 | 9/1994 |
| JP | 08-078689 | 3/1996 |
| JP | 09-045931 | 2/1997 |
| JP | 10-223533 | 8/1998 |

* cited by examiner

Primary Examiner—Jerome Jackson
(74) Attorney, Agent, or Firm—Edwards & Angell, LLP; David G. Conlin; George W. Hartnell, III

(57) ABSTRACT

An a-Si film 12 is formed on the whole surface of a quartz substrate 11, and a protection film 13 is formed in a region to be used as a display unit on the a-Si film 12. Subsequently, after a catalyst metal is selectively introduced into the whole surface of a region to be used as a peripheral drive circuit on the a-Si film 12, crystal growth is allowed by heating the a-Si film 12 to form a CG silicon film 14 and a p-Si film 15. Then, the catalyst metal in the CG silicon film 14 and the p-Si film 15 is removed by gettering. The concentration of the catalyst metal in the CG silicon film 14 is in the range of $1 \times 10^{13}$ atoms/cm$^{13}$ or higher and lower than $1 \times 10^{15}$ atoms/cm$^3$. The concentration of the catalyst metal in the p-Si film for a display unit 15 is made lower than the concentration of the catalyst metal in the CG silicon film 14b for a peripheral drive circuit. Thereby, a semiconductor device having a driver monolithic type liquid crystal display device with high intensity, high precision and uniform characteristics can be achieved.

6 Claims, 11 Drawing Sheets

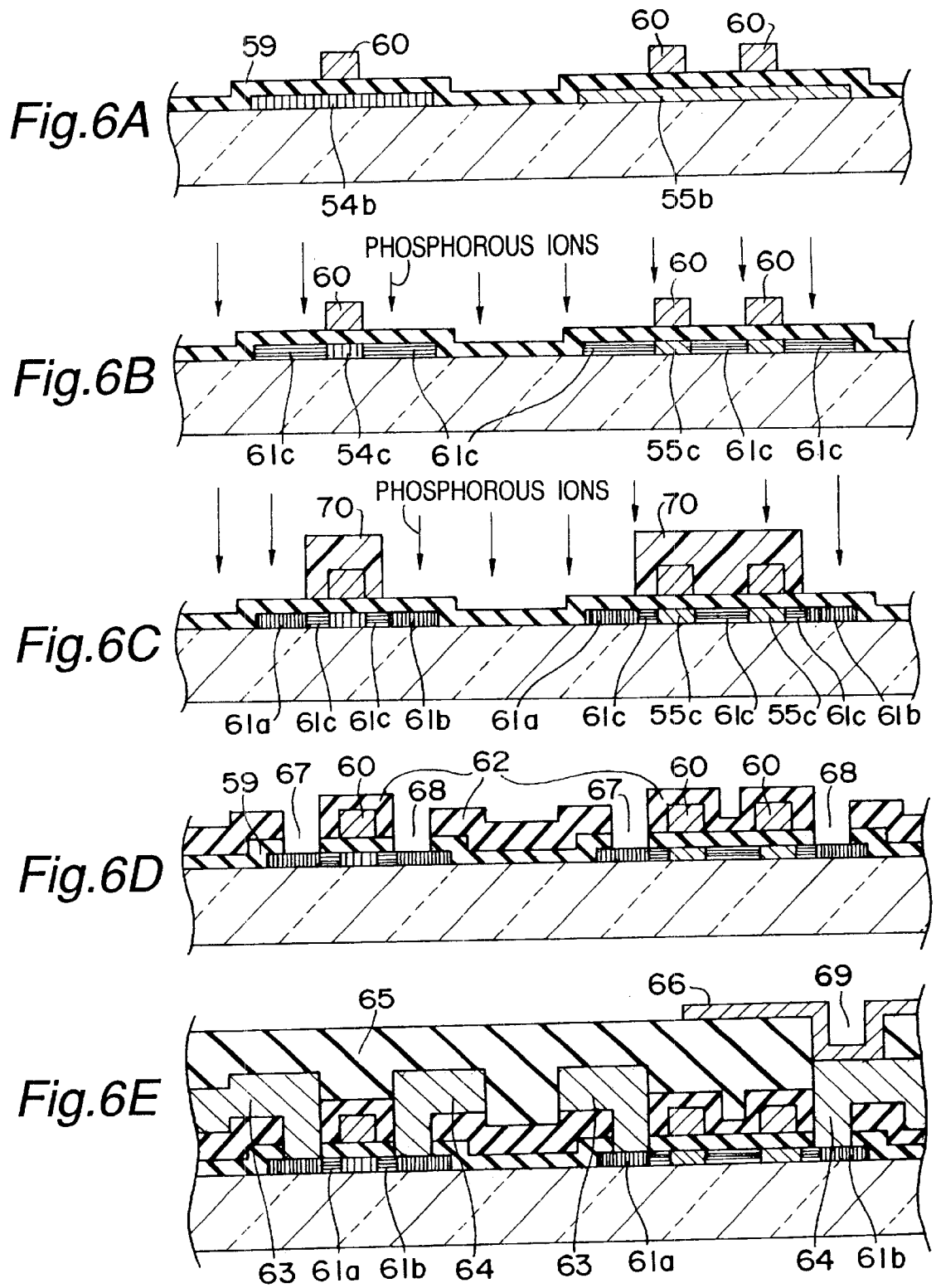

55c  61d  55c 55c  61e  55c 71
(CATALYST METAL IS
ADDED TO SURFACE)

72

DOMAIN
GROWTH
DIRECTION

73

74

ACTIVE MATRIX DISPLAY DEVICE HAVING HIGH INTENSITY AND HIGH PRECISION AND MANUFACTURING METHOD THEREOF

BACKGROUND OF THE INVENTION

The present invention relates to a semiconductor device in use for an active matrix display device, wherein a liquid crystal is driven by a thin film transistor, particularly, a driver monolithic type liquid crystal display device, wherein a peripheral drive circuit is on the same substrate, and the like and a method of manufacturing the same.

Among thin type liquid crystal display devices with low power consumption, those using a thin film transistor (hereinafter, referred to as TFT) for a drive element are mainly used for a display unit of a personal computer or the like, a portable TV (television) and the like due to its high performance such as high contrast, high response speed and so forth, and its market size has been greatly expanded in recent years.

The TFTs in use for a liquid crystal display device include the one wherein a CG silicon film is used as a semiconductor of its active portion. As described in Japanese Patent Laid-Open Publication No. 6-244103, this CG silicon film is a silicon film having excellent crystallinity obtained by depositing a trace of a kind of metal element such as nickel Ni or the like on the surface of an amorphous silicon film and thereafter heating the film.

Since the CG silicon film has lower power consumption and faster response than an amorphous silicon film and a polycrystalline silicon and has an advantage that a future sheet computer can be manufactured by utilizing its high mobility, it is considered promising as a material for manufacturing a next-generation driver monolithic type liquid crystal display device.

The CG silicon film is a crystalline silicon film formed by adding a metal element for promoting crystallinity into an amorphous silicon film and thereafter heating the film. A method of removing the metal element introduced into silicon Si at this time is disclosed in Japanese Patent Laid-Open Publication No. 10-223533. In this Japanese Patent Laid-Open Publication No. 10-223533, a part of the formed CG silicon film is doped with a 5th group element P (phosphorous) in high concentration and subsequently heat treated, thereafter the metal element is removed from a region to be used as an active portion of the TFT by gettering the metal from the region doped with P (phosphorous).

Furthermore, methods of forming a CG silicon film include a method called longitudinal growth and a method called lateral growth. The longitudinal growth is a method wherein a metal element is directly added to the whole surface of an amorphous silicon film and then heated to allow crystal growth. Meanwhile, the lateral growth is a method wherein, for example, a $SiO_2$ film formed on an amorphous silicon film is photopatterned so that a part of the amorphous silicon film is exposed, a metal element is added to the exposed portion and the film is heated so that crystals are grown in a direction horizontal with respect to a substrate into a portion where the amorphous silicon film is not exposed.

Here, the longitudinal growth, which is the most relevant to the present invention, will be explained in detail.

FIGS. 11A–11D show how the longitudinal growth occurs in a CG silicon film. FIGS. 11A–11D are all plan views viewed from the film surface side. In FIGS. 11A–11D, reference numeral 71 denotes an amorphous silicon film. Reference numeral 72 denotes a Si crystal, which is to be a nucleus. Reference numeral 73 denotes a CG silicon crystal (also referred to as "domain"). Reference numeral 74 denotes a domain boundary.

First, as shown in FIG. 11A, a catalyst metal element is added to the surface of an amorphous silicon film 71 on a quartz substrate.

Subsequently, when solid-phase crystal growth is allowed in this amorphous silicon film 71 at temperature of about 600° C. for about 1 hour, a Si crystal 72 which is to be a nucleus is formed at several points on the quartz substrate as shown in FIG. 11B. The generation density of the Si crystals 72 which are to be nuclei is affected by the quality of the amorphous silicon film 71, the concentration of an added metal element and so forth.

When solid-phase crystal growth is further allowed for a long time, CG silicon crystals 73 grow radially from the crystal to be a nucleus as a center as shown in FIG. 11C. The region of these CG silicon crystals grown from one nucleus as a center is referred to as a domain. While the inside of this domain 73 is polycrystalline, this can be considered as a so-to-speak quasi-single crystal since these crystals are known to have better continuity than those of p-Si.

When solid-phase crystal growth is further allowed for a long time, the grown domains 73 are finally bumped against each other as shown in FIG. 11D. Then, the whole surface of the substrate becomes a CG silicon film, and the growth finishes. In FIG. 11D, a place where the domains 73 are bumped against each other is referred to as a domain boundary 74. The size of these domains depends on the formation conditions, but a big domain may exceed 200 μm in diameter.

Meanwhile, when a TFT is formed by the CG silicon film, either the longitudinal growth or the lateral growth is employed. However, when a TFT is formed by lateral growth, the amount of a catalyst metal to be introduced must be about ten times more than the amount introduced for longitudinal growth. The reason for this is that, if the amount of the catalyst metal to be introduced is reduced, a distance of crystal growth in the horizontal direction becomes shorter, or a portion where few crystals grow is generated. Therefore, the CG silicon film by lateral growth inevitably contains a more amount of the catalyst metal than the silicon film by longitudinal growth. Thus, it is highly likely that the amount of the residual catalyst metal after gettering is naturally more in the laterally grown CG silicon film than in the longitudinally grown CG silicon film. Since metal element residues in such a silicon film adversely affect TFT characteristics (particularly OFF characteristics), changes with time such as deterioration or the like and so forth, a more excellent TFT can be obtained by reducing the metal element in the TFT to a minimum.

Consequently, the longitudinally grown CG silicon film is considered to be more suitable to formation of an active region of a TFT than the laterally grown CG silicon film.

Meanwhile, when a TFT is formed by the CG silicon film, either the longitudinal growth or the lateral growth is employed. However, when a TFT is formed by lateral growth, the amount of a catalyst metal to be introduced must be about ten times more than the amount introduced for longitudinal growth. The reason for this is that, if the amount of the catalyst metal to be introduced is reduced, a distance of crystal growth in the horizontal direction becomes shorter, or a portion where few crystals grow is generated.

Therefore, the CG silicon film by lateral growth inevitably contains a greater amount of the catalyst metal than the silicon film by longitudinal growth. Thus, it is highly likely that the amount of the residual catalyst metal after gettering is naturally more in the laterally grown CG silicon film than in the longitudinally grown CG silicon film. Since metal element residues in such a silicon film adversely affect TFT characteristics (particularly OFF characteristics), changes with time such as deterioration or the like and so forth, a more efficient TFT can be obtained by reducing the metal element in the TFT to a minimum.

Since each of the TFTs for pixels of the display unit is responsible for the display of a different pixel, the differences in characteristics lead to differences in an electric potential applied to each pixel electrode, a charge holding time or the like, which are directly reflected on differences in transmittance of liquid crystal. That is, in display on a TFT panel using a longitudinally grown CG silicon film, light transmittance of each pixel varies depending on the presence or absence of a domain boundary in a TFT active region of the display unit. Therefore, there is high possibility that the variation results in uneven display.

Furthermore, a leak current of the TFT for a pixel of a display unit in an OFF state must be kept lower than that of the TFT for a peripheral drive circuit. However, when the TFT for a pixel is formed by introducing a catalyst metal, there is a possibility that a residual metal exists even after a step of removing the catalyst metal by gettering as described above, and the residual metal may deteriorate the OFF characteristics of the TFT.

To avoid the uneven display of a liquid crystal display region and the deterioration of TFT OFF characteristics, a method of forming a TFT in a state of an amorphous silicon film without introducing a catalyst metal into a screen is suggested as described in Japanese Patent Laid-Open Publication No. 8-78689. However, when an amorphous silicon film forms a TFT active region in the screen, TFT characteristics are naturally deteriorated compared with a TFT formed by polycrystalline silicon or CG silicon.

Currently, a display unit of a liquid crystal panel is being developed towards high intensity and high precision. Since sufficient ON characteristics cannot be obtained from a TFT using an amorphous silicon film, formation of a TFT for display unit by using an amorphous silicon film is difficult in practice.

Furthermore, Japanese Patent Laid-Open Publication No. 9-45931 discloses a method of forming TFTs in a screen by crystalline silicon, which is not CG silicon, and using CG silicon for a peripheral drive circuit. However, in this method, a residual concentration of the catalyst metal element in the peripheral drive circuit is high. Since the catalyst metal element is considered to affect TFT characteristics and reliability of the peripheral drive circuit, practical use is still difficult.

Accordingly, an object of the present invention is to provide a semiconductor device and a method of manufacturing the same by which a driver monolithic type liquid crystal display device with high intensity, high precision and uniform characteristics can be achieved.

SUMMARY OF THE INVENTION

In order to achieve the above object, there is provided a semiconductor device including a display unit having pixel electrodes arranged in a matrix and transistors for a pixel connected to the pixel electrodes and a peripheral drive circuit having a transistor for a peripheral drive circuit provided outside the display unit, wherein the transistor for a peripheral drive circuit has a first crystalline silicon film, which is to be a crystal grown active region formed by introducing a catalyst metal into an amorphous silicon film and heating the film;

the transistor for a pixel has a second crystalline silicon film, which is to be an active region, formed by crystallizing the amorphous silicon film without introducing the catalyst metal; and the concentration of the catalyst metal in the second crystalline silicon film is lower than the concentration of the catalyst metal in the first crystalline silicon film.

In one embodiment of the present invention, the concentration of the catalyst metal in the first crystalline silicon film is in the range of $1\times10^{13}$ atoms/cm$^3$ or higher and lower than $1\times10^{15}$ atoms/cm$^3$.

According to a semiconductor device of the above constitution, in the above transistor for a peripheral drive circuit, in which a first crystalline silicon film (CG silicon film) wherein crystals are grown by introducing a catalyst metal into the amorphous silicon film and thereafter heating the film is used as an active region, the concentration of the catalyst metal in the first crystalline silicon film is in the range of $1\times10^{13}$ atoms/cm$^3$ or higher and lower than $1\times10^{15}$ atoms/cm$^3$. Therefore, the catalyst metal does not greatly affect transistor characteristics, and hence a high ON-current operation can be performed. It is noted that, in the transistor for a pixel, wherein a second crystalline silicon film, in which an amorphous silicon film is crystallized without introducing a catalyst metal, is used as an active region, a low OFF-current operation can be performed since the concentration of the catalyst metal in the second crystalline silicon film is lower than the concentration of the catalyst metal in the first crystalline silicon film. Thus, a driver monolithic type liquid crystal display device with high intensity, high precision and uniform characteristics can be achieved.

The concentration of the catalyst metal in the first crystalline silicon film in the range of $1\times10^{13}$ atoms/cm$^3$ or higher and lower than $1\times10^{15}$ atoms/cm$^3$ is measured by a measuring method called ICP (Inductively Coupled Plasma)—MS (Mass Spectrometer).

The applicants of the present invention used nickel Ni as a catalyst metal, formed the whole surface of a substrate by a CG silicon film and removed the CG silicon film by gettering. Then, they measured the amount of nickel Ni element in this sample CG silicon film by atomic absorption photometry. As a result, the amount of the nickel Ni element in the CG silicon film was $4\times10^9$ atoms/cm$^2$ or less in average over the whole substrate surface. Since the CG silicon film had a thickness of 70 nm and a area ratio of 65% on the substrate at this time, the concentration of the catalyst metal in the CG silicon film was converted to $8.79\times10^{14}$ atoms/cm$^3$ or lower, which satisfied the above catalyst metal concentration in the range of $1\times10^{13}$ atoms/cm$^3$ or higher and lower than $1\times10^{15}$ atoms/cm$^3$.

In one embodiment of the present invention, the transistor for a pixel has an active region, a pair of high-concentration impurity regions, which are to be source regions, and drain regions formed on both sides of the active region and a pair of low-concentration impurity region formed between the source region and the active region and between the drain region and the active region.

According to the semiconductor device of the above embodiment, a structure having a pair of low-concentration impurity regions formed between the source region and the active region and between the drain region and the active region is called an LDD (lightly doped drain) structure.

Since an OFF current can be reduced without reducing the ON current of the transistor, this structure is very effective as a transistor structure for a pixel.

In one embodiment of the present invention, the transistor for a pixel has two active regions formed with a prescribed gap therebetween, a pair of high-concentration impurity regions to be used as a source region and a drain region formed on both sides of the two active regions, a pair of low-concentration impurity regions formed between the high-concentration impurity region to be used as the source region and one of the active regions adjacent to the high-concentration impurity region and between the high-concentration impurity region to be used as the drain region and the other active region adjacent to the high-concentration impurity region, and an impurity region formed in a region sandwiched between the two active regions.

According to the semiconductor device of the above embodiment, a structure having the two active regions, a pair of high-concentration impurity regions, a pair of low-concentration impurity regions and an impurity region between the two active regions is a structure wherein two LDD-structure transistors are arranged in series (hereinafter, referred to as a dual LDD structure). The transistor in this dual LDD structure is characterized by uniformed and stabilized characteristics of a transistor for a pixel. That is, when the formed transistors are compared with each other, there are more or less variations in characteristics. When one transistor is in charge of one pixel, a problem of uneven display in a liquid crystal panel or the like may occur due to the characteristic variation. Therefore, characteristics are balanced by two transistors by employing transistors in this dual LDD structure, and hence uniformity of the whole transistor is improved and occurrence of a problem such as uneven display or the like can be prevented.

In one embodiment of the present invention, the impurity region formed in the region sandwiched between the two active regions contains at least either one of:

an impurity region having the same concentration as that of the pair of high-concentration impurity regions, which are to be the source region and the drain region, or an impurity region having the same concentration as that of the pair of low-concentration impurity regions.

According to the semiconductor device of the above embodiment, for example, the impurity region formed in a region sandwiched between the above two active regions is an impurity region having the same concentration as that of the pair of high-concentration impurity regions to be used as the source region and the drain region. Therefore, two transistors are connected in series so that a dual LDD structure is formed. Furthermore, the impurity region formed in a region sandwiched between the two active regions is an impurity region having the same concentration of that of the pair of low-concentration impurity regions. Therefore, a dual LDD structure is similarly formed. Furthermore, this structure is similarly formed when the impurity region formed in a region sandwiched between the two active regions includes both an impurity region having the same concentration as that of the pair of high-concentration impurity regions and an impurity region having the same concentration as that of the pair of low-concentration impurity regions.

In one embodiment of the present invention, the active region of the transistor for a peripheral drive circuit formed in the first crystalline silicon film and the active region of the transistor for a pixel formed in the second crystalline silicon film have a distance of at least 100 μm or longer therebetween.

This is because, when a catalyst metal is introduced into a region where the first crystalline silicon film is to be formed and thereafter the region is heated, a CG silicon film grown from the region into which the catalyst metal has been introduced is grown a certain distance and enters a region where a second crystalline silicon film is formed and into which the catalyst metal is not introduced originally. That is, a crystalline silicon film containing an originally unintended catalyst metal element is formed between the first crystalline silicon film and the second crystalline silicon film. This region in the second crystalline silicon film, into which the CG silicon is grown into, is less than 100 μm as a result of observation in experiments so far although there are variations. The crystalline silicon film of this region, into which the CG silicon is grown into, has a composition different from those of the first crystalline silicon film and the second crystalline silicon film, and hence characteristics of this silicon film are different from those of the other films. Therefore, the silicon film of this region cannot be used for a transistor for a peripheral drive circuit or a transistor for a display unit.

Therefore, according to the semiconductor device of the above embodiment, by keeping a distance of at least 100 μm or more between an active region of a transistor for a peripheral drive circuit formed by the first crystalline silicon film and an active region of a transistor for a pixel formed by the second crystalline silicon film, the silicon film in the region, into which CG silicon is grown into, can be reliably prevented from being used as a transistor for a peripheral drive circuit or a transistor for a display unit.

Also, there is provided a semiconductor device manufacturing method of manufacturing the above semiconductor device, wherein, the catalyst metal in the first crystalline silicon film is removed by gettering.

According to the above method of manufacturing a semiconductor device, the concentration of the catalyst metal in the first crystalline silicon film can be made in the range of $1 \times 10^{13}$ atoms/cm$^3$ or higher and lower than $1 \times 10^{15}$ atoms/cm$^3$ by removing the catalyst metal in the first crystalline silicon film by gettering.

There is provided a method of manufacturing a semiconductor device including a display unit having pixel electrodes arranged in a matrix and transistors for a pixel connected to the pixel electrodes and a peripheral drive circuit having a transistor for a peripheral drive circuit provided outside the display unit, which comprises the steps of:

forming an amorphous silicon film over the whole surface of a substrate;

forming a protection film on a region to be used as a display unit in the amorphous silicon film;

after forming the protection film, introducing a catalyst metal into the region to be used as a peripheral drive circuit in the amorphous silicon film except for the region covered with the protection film;

after introducing a catalyst metal into the region to be used as the peripheral drive circuit, forming a crystalline silicon film by heating the amorphous silicon film to grow crystals in the region to be used as a peripheral drive circuit and the region to be used as a display unit; and removing the catalyst metal in the crystalline silicon film by gettering.

According to the above method of manufacturing a semiconductor device, a protection film is formed on the region to be used as a display unit in an amorphous silicon film formed over the whole substrate surface, and then a catalyst metal is introduced into the region to be used as a peripheral drive circuit in the amorphous silicon film except for the region covered with the protection film. Subsequently, the amorphous silicon film is heated so that crystal growth is allowed in the region to be used as a peripheral drive circuit to form a crystalline silicon film (longitudinally grown CG silicon film), while crystal growth is allowed in the region to be used as a display unit to form a crystalline silicon film (polycrystalline silicon film). Then, the catalyst metal in the crystalline silicon film is removed by gettering. Thus, by using a longitudinally grown CG silicon film formed by directly adding a catalyst metal as a transistor for a peripheral drive circuit and a polycrystalline silicon film formed without adding a catalyst metal as a transistor for a display unit, a driver monolithic type liquid crystal display device with stable operations and high display quality can be manufactured.

In one embodiment of the present invention, the catalyst metal is at least one kind selected from Fe, Co, Ni, Pd, Pt, Cu, Au, In and Sn.

According to the method of manufacturing a semiconductor device of the above embodiment, as long as at least one or a plurality of kinds of elements selected from Fe, Co, Ni, Pd, Pt, Cu, Au, In and Sn are used as the catalyst elements, an effect of promoting crystallization can be obtained by using only a trace thereof. In particular, among these catalyst elements, a most remarkable effect can be obtained when Ni is used.

In one embodiment of the present invention, the protection film formed on the region to be used as a display unit in the amorphous silicon film is silicon oxide having a film thickness of 100 nm or larger.

According to the method of manufacturing a semiconductor device of the above embodiment, by forming silicon oxide having a film thickness of 100 nm or larger as a protection film formed on the region to be used as a display unit in the amorphous silicon film, the region to be used as a display unit in the amorphous silicon film is masked, thereby reliably preventing the introduction of the catalyst metal into the region to be used as a display unit when the catalyst metal is introduced.

In one embodiment of the present invention, in the step of growing crystals in the region to be used as a peripheral drive circuit and the region to be used as a display unit by heating the amorphous silicon film to form a crystalline silicon film, the heating temperature is in the range of 500–700° C.

According to the method of manufacturing a semiconductor device of the above embodiment, favorable silicon crystallization can be achieved by heating the amorphous silicon film at temperature in the range of 500–700° C.

In one embodiment of the present invention, the step of removing the catalyst metal from the crystalline silicon film by gettering includes steps of:

introducing a 15th group element selectively into the crystalline silicon film;

moving the catalyst metal in the crystalline silicon film by heating the crystalline silicon film to a region of the crystalline silicon film into which the 15th element is selectively introduced; and after moving the catalyst metal in the crystalline silicon film to a region in the crystalline silicon film into which the 15th group element is selectively introduced, etching is performed to remove the region in the crystalline silicon film to which the catalyst metal is moved.

According to the method of manufacturing a semiconductor device of the above embodiment, a 15th group element is selectively introduced into the crystalline silicon film, and thereafter, by heating the crystalline silicon film, the catalyst metal in the crystalline silicon film is moved to a region in the crystalline silicon film into which the 15th group element is selectively introduced. Thus, since the region in the crystalline silicon film into which the 15th group element is selectively introduced, that is the region to which the catalyst metal is moved, is removed by etching, little catalyst metal is contained in the remaining crystalline silicon film.

In one embodiment of the present invention, the region in the crystalline silicon film into which the 15th group element is selectively introduced is formed not only in the region to be used as a peripheral drive circuit into which the catalyst metal is introduced, but also in the region to be used as a display unit into which the catalyst metal is not introduced.

Since the catalyst metal added to the first crystalline silicon film is subjected to a heating process and the like, the catalyst metal may be introduced into the second crystalline silicon film by diffusion.

Therefore, according to the method of manufacturing a semiconductor device of the above embodiment, by also providing a portion for the second crystalline silicon film with a gettering region to perform gettering of the catalyst metal, deterioration of transistor characteristics due to the catalyst metal can be prevented and a transistor for a pixel with a low OFF current can be manufactured.

In one embodiment of the present invention, in the step of moving the catalyst metal in the crystalline silicon film by heating the crystalline silicon film to the region in the crystalline silicon film into which the 15th group element is selectively introduced, the heating temperature is in the range of 500–800° C.

According to the method of manufacturing a semiconductor device of the above embodiment, by heating the crystalline silicon film at temperature in the range of 500–800° C., the catalyst metal can be effectively removed by gettering.

In one embodiment of the present invention, after the step of growing crystals in the region to be used as a peripheral drive circuit and the region to be used as a display unit by heating the amorphous silicon film to form a crystalline silicon film, a step of reducing the film thickness of at least a region to be used as the active region of a display unit in the crystalline silicon film is included.

Characteristics of a transistor for a pixel made of a crystalline silicon film formed by allowing crystal growth in the region to be used as a display unit depend on the initial thickness of the amorphous silicon film before the film thickness is reduced and the final film thickness of the active region. FIG. 12 shows a relationship of ON-current and OFF-current characteristics of the transistor for a pixel to the initial thickness of the amorphous silicon film before the film thickness is reduced. In the transistor used in this measurement, both the active regions are formed in the same film thickness of 40 nm. The gate voltage at ON is set to be 5 V, the gate voltage at OFF is set to be −10 V and the drain voltage is set to be 9 V (at both ON and OFF). It is noted that a current value of, for example, "1.E−07" represents $1.0 \times 10^{-07}$ in FIG. 12.

FIG. 12 shows that, when the initial thickness of the amorphous silicon film is larger, both the ON and OFF characteristics of the transistor are more favorable. However, the OFF characteristics of the transistor are more favorable due to a lower current value when the film thickness of the active region is smaller.

According to the method of manufacturing a semiconductor device of the above embodiment, when the initial thickness of the amorphous silicon film is made larger, the film thickness needs to be reduced to make the film thickness of the active region thinner in subsequent processes. The OFF characteristics of the transistor for a pixel become more favorable by reducing the film thickness of at least a region to be used as an active region of the display unit in the crystalline silicon film.

In one embodiment of the present invention, in the step of forming an amorphous silicon film on the whole surface of the substrate, the thickness of the amorphous silicon film is in the range of 100–150 nm.

According to the method of manufacturing a semiconductor device of the above embodiment, sufficient crystal growth can be obtained by making the thickness of the amorphous silicon film 100 nm or larger, and when the initial thickness of the amorphous silicon film before the film thickness is reduced is larger, both the ON and OFF characteristics of the transistor become more favorable. On the other hand, when the thickness of the amorphous silicon film exceeding 150 nm is not favorable in view of manufacturing costs since time is required to form an amorphous silicon film and reduce the film thickness later.

In one embodiment of the present invention, in the step of reducing the film thickness of at least a region to be used as the active region of a display unit in the crystalline silicon film, the film thickness is reduced by thermal oxidation.

According to the method of manufacturing a semiconductor device of the above embodiment, reduction of the thickness of the crystalline silicon film by thermal oxidation is more effective than silicon film reduction by dry etching since defects, impurities or the like in silicon Si can be reduced.

In one embodiment of the present invention, in the step of reducing the film thickness of at least a region to be used as the active region of a display unit in the crystalline silicon film, the thickness of the reduced crystalline silicon film is in the range of 20–60 nm.

According to the method of manufacturing a semiconductor device of the above embodiment, favorable OFF-current characteristics can be obtained by making the thickness of the crystalline silicon film in the range of 20–60 nm.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 6A–6E are cross sectional views showing processes of manufacturing the driver monolithic type active matrix circuit following FIGS. 5A–5E;

DETAILED DESCRIPTION OF THE PREFERRED EMBODIMENTS

Hereafter, embodiments of the semiconductor device and the method of manufacturing the same of the present invention will be explained in detail with reference to accompanying drawings.

First Embodiment

Figure 1A:
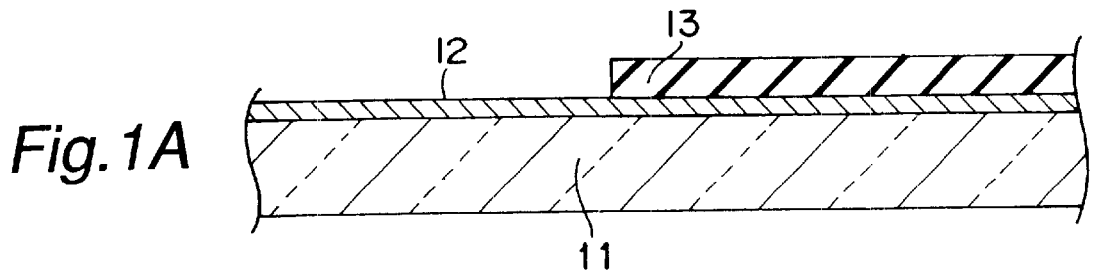
FIGS. 1A–1E are cross sectional views showing processes of manufacturing a driver monolithic type active matrix circuit as a semiconductor device according to a first embodiment of the invention.
Figure 1B:
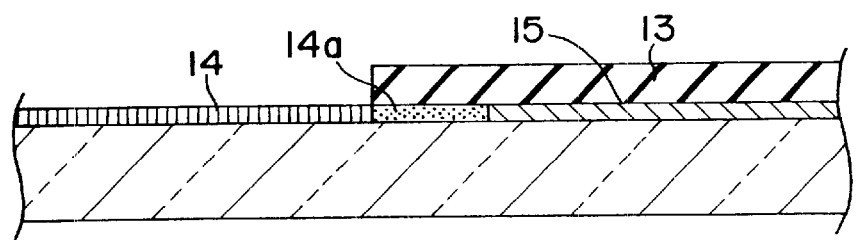
Figure 1C:
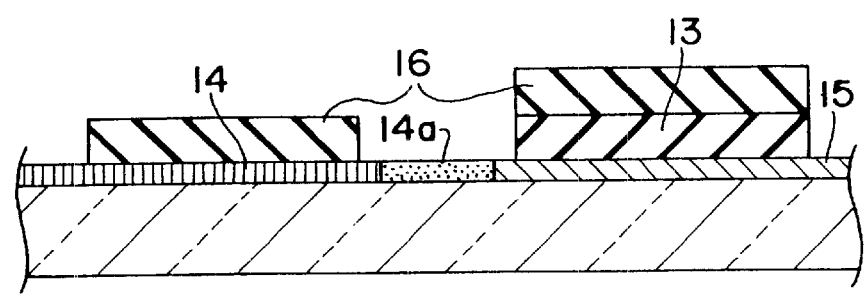
Figure 1D:
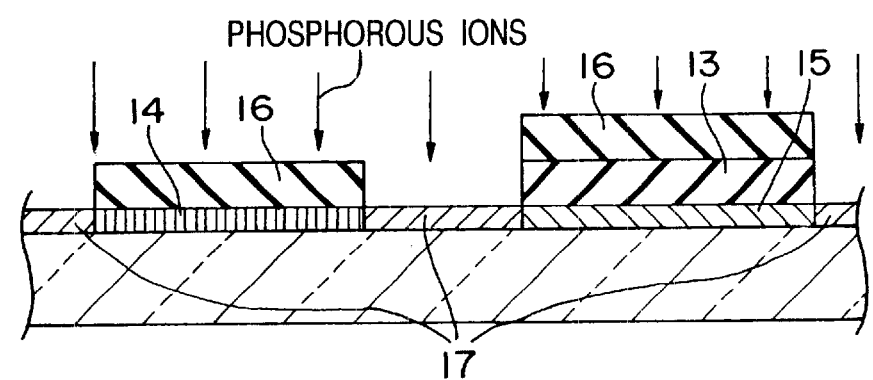
Figure 1E:
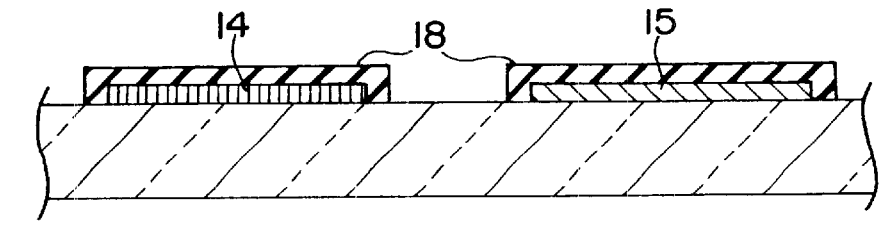
Figure 2A:
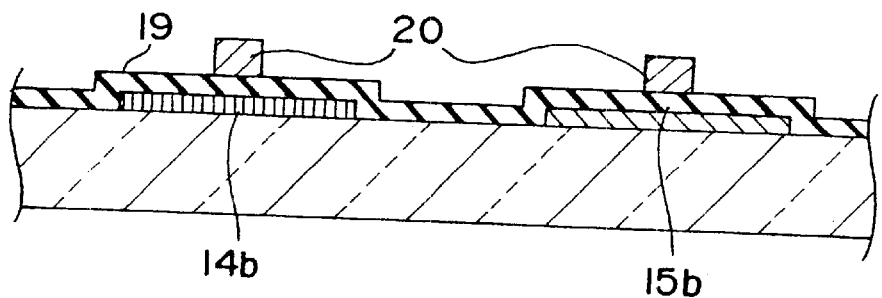
FIGS. 2A–2C are cross sectional views showing processes of manufacturing the driver monolithic type active matrix circuit following FIGS. 1A–1E.
Figure 2B:
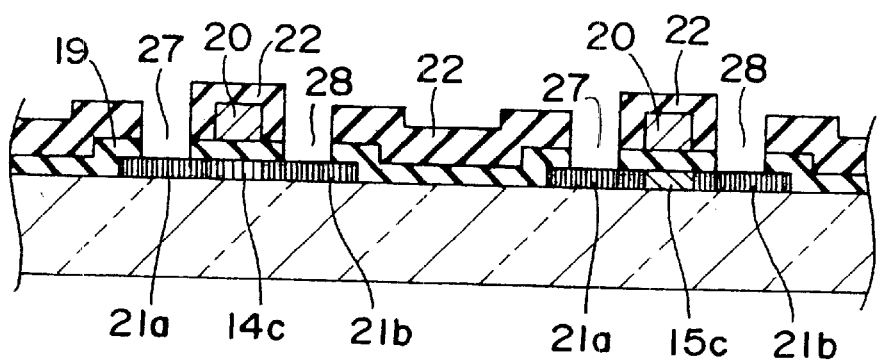
Figure 2C:
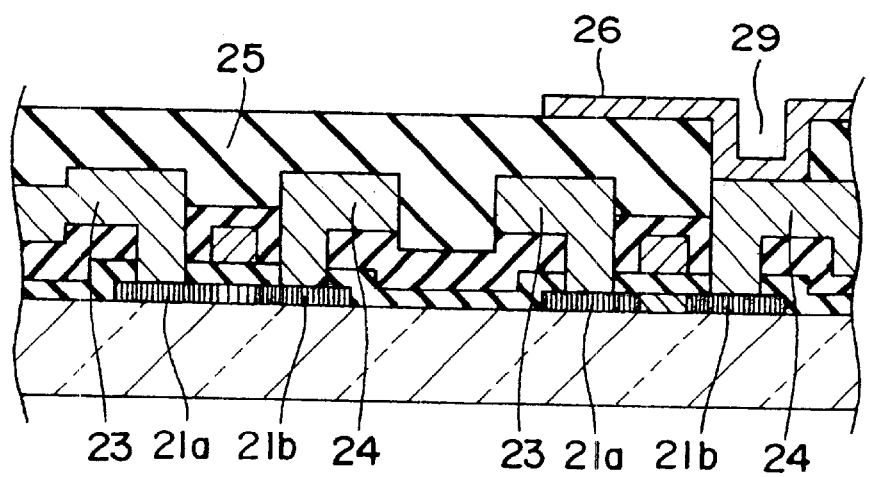
Figure 3A:
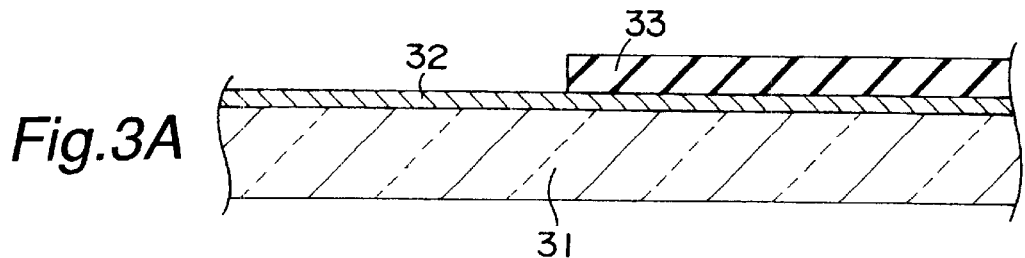
FIGS. 3A–3E are cross sectional views showing processes of manufacturing a driver monolithic type active matrix circuit as a semiconductor device according to a second embodiment of the invention.
Figure 3B:
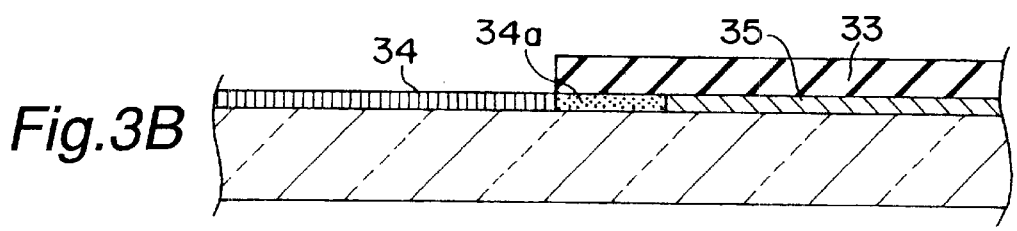
Figure 3C:
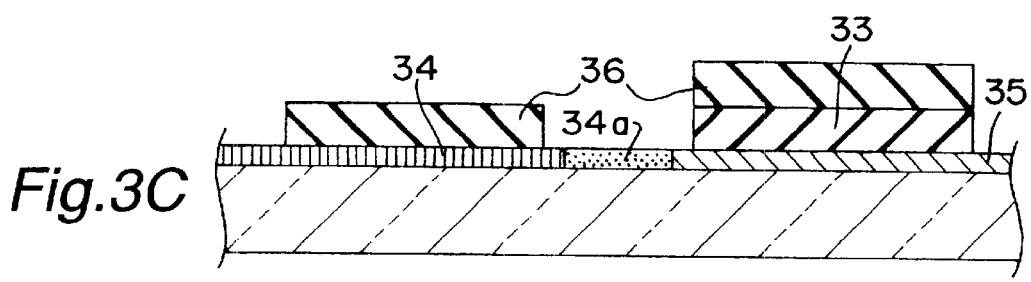
Figure 3D:
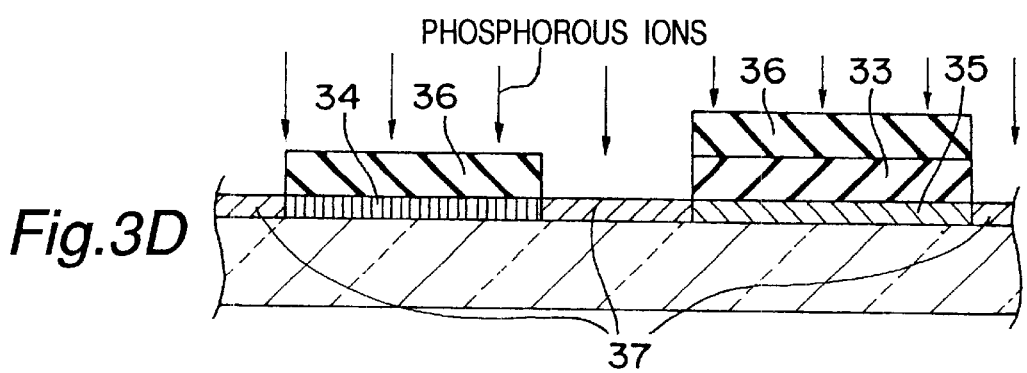
Figure 3E:
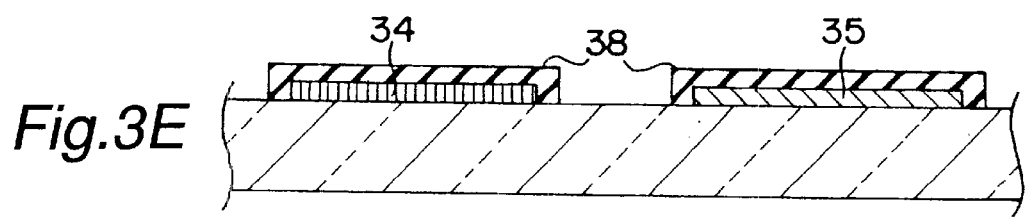
Figure 4A:
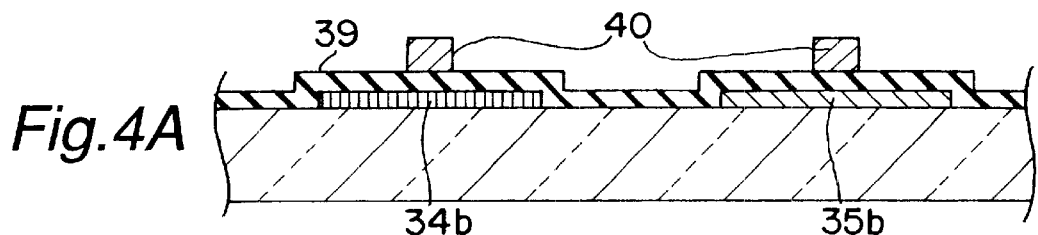
FIGS. 4A–4E are cross sectional views showing processes of manufacturing the driver monolithic type active matrix circuit following FIGS. 3A–3E.
Figure 4B:
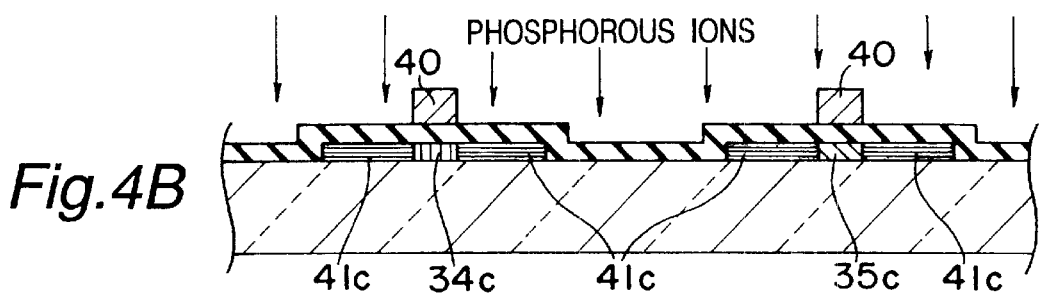
Figure 4C:
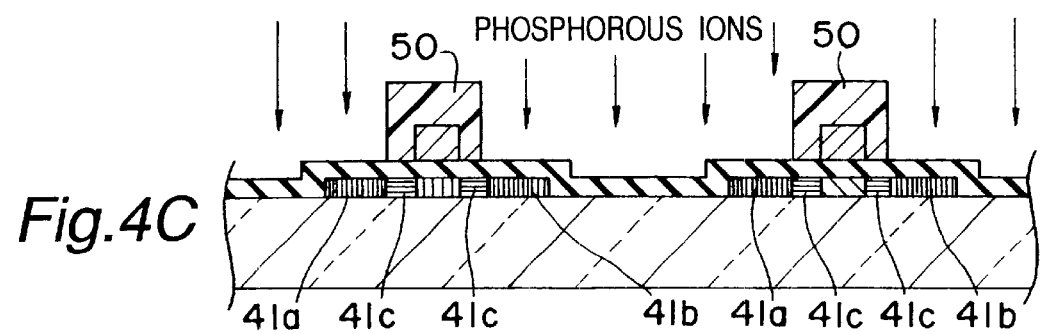
Figure 4D:
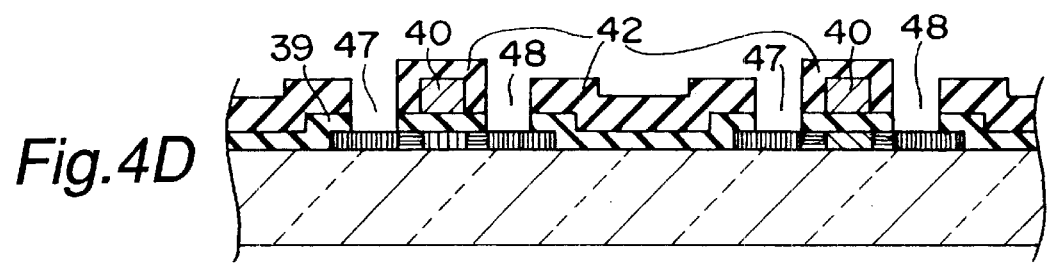
Figure 4E:
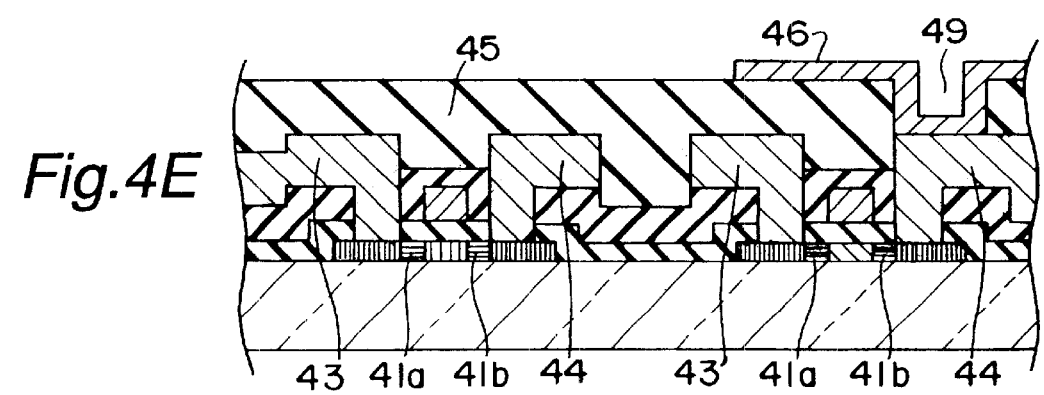
Figure 5A:
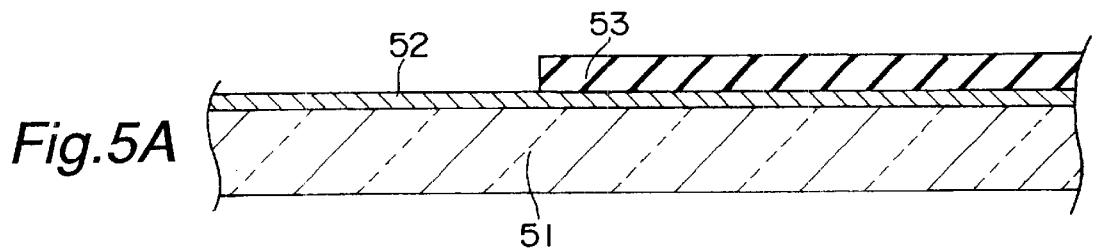
FIGS. 5A–5E are cross sectional views showing processes of manufacturing a driver monolithic type active matrix circuit as a semiconductor device according to a third embodiment of the invention.
Figure 5B:
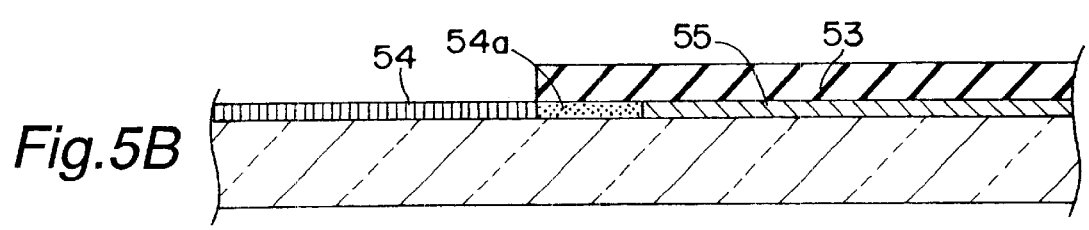
Figure 5C:
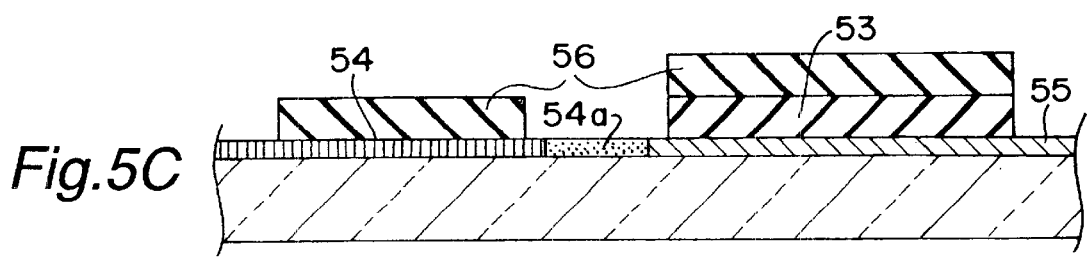
Figure 5D:
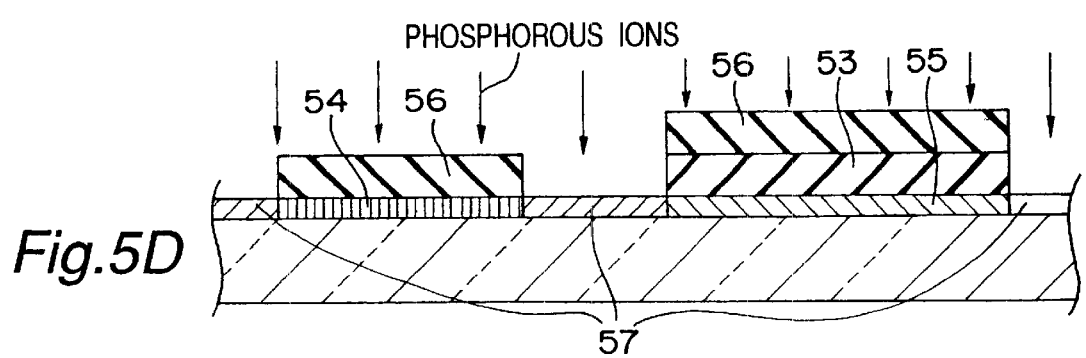
Figure 5E:
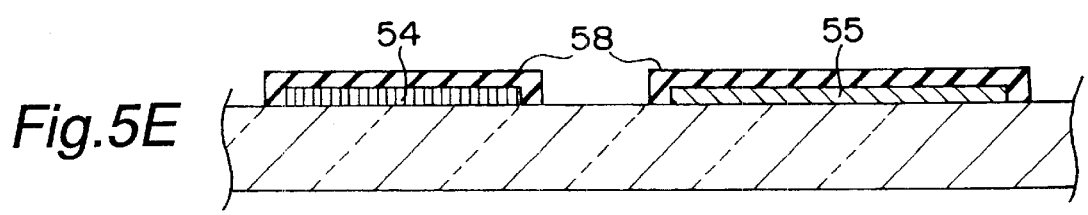

FIGS. 1 and 2 show processes of manufacturing a driver monolithic type active matrix circuit as a semiconductor device according to a first embodiment of the invention. The manufacturing process proceeds from FIGS. 1A–1E to FIGS. 2A–2C successively. In FIGS. 1 and 2, a peripheral drive circuit is shown on the left side, and a matrix circuit of a display unit is shown on the right side. For simplification, only an N-MOS transistor of the peripheral drive circuit is shown, and a P-MOS transistor is not shown since it is easily inferred.

(1-1) FIG. 1A

First, an amorphous silicon film (hereinafter, referred to as a-Si film) 12 is deposited 70 nm on a quartz substrate 11 by the plasma CVD method or the LPCVD (Low Pressure Chemical Vapor Deposition) method. A protection film 13 made of a $SiO_2$ film is laminated 100 nm by the atmospheric CVD method or the like. Then, the protection film 13 is patterned by general photolithography and wet etching to expose a part of the a-Si film 12. At this time, the protection film 13 is patterned so that a region to be used as a peripheral drive circuit is within a region where the a-Si film 12 is exposed and that a region to be used as a matrix circuit of a display unit is within a region protected by the protection film 13.

(1-2) FIG. 1B

Subsequently, the whole surface of the a-Si film 12 (shown in FIG. 1A) and the protection film 13 is coated with an aqueous solution in which 10 ppm of nickel acetate $Ni(CH_3COOH)_2$ is dissolved by spinning to add nickel Ni as a catalyst metal element for promoting crystallization of silicon Si. The nickel Ni concentration in the a-Si film 12 surface is set to be about $3\times10^{12}$ atoms/cm$^2$. Furthermore, sputtering, CVD, plasma treatment, vapor deposition or the like can also be employed as a method of adding the nickel Ni to the a-Si film 12 surface. Subsequently, heat treatment is performed in a nitrogen atmosphere to crystallize the a-Si film 12 and thereby form a CG silicon film 14. This heat treatment is preferably performed at temperature in the range of 500–700° C. Conditions of this embodiment are 600° C. for 12 hours. At this time, the a-Si film 12 under the protection film 13 does not become a CG silicon film since the catalyst metal is not added thereto. However, crystallization of silicon Si is promoted by heat treatment at 600° C. for 12 hours, and the a-Si film 12 under the protection film 13 becomes a polycrystalline silicon (hereinafter, referred to as p-Si) film 15. Furthermore, at this time, the CG silicon film also grows from a boundary between an exposed portion of the a-Si film 12 and the protection film 13 towards the inside of the a-Si film 12 under the protection film 13. This growth distance is about 100 $\mu$m from the boundary between the exposed portion of the a-Si film 12 and the protection film 13 to the p-Si film 15 side. The film in this portion is assumed as a CG silicon film 14a. This CG silicon film 14a is not used for active regions of a TFT for a peripheral drive circuit and a TFT for a display unit. Therefore, it is designed in advance such that a TFT is not formed in a region of the CG silicon film 14a, and hence the active regions of a TFT for a peripheral drive circuit and a TFT for a display unit are inevitably distant from each other by 100 $\mu$m or more.

(1-3) FIG. 1C

Subsequently, a first oxide film 16 is laminated 200 nm on the CG silicon film 14 containing nickel Ni and the protection film 13 by the atmospheric CVD method or the like. At this time, the protection film 13 may be removed by etching before the first oxide film 16 is laminated. Then, the first oxide film 16 and the protection film 13 are patterned by general photolithography and wet etching to expose the CG silicon film 14, a part of the p-Si film 15 and CG silicon film 14a.

(1-4) FIG. 1D

Subsequently, about $2 \times 10^{15}$ atoms/cm$^2$ of phosphorous ions are implanted over the whole substrate. At this time, the protection film 13 and the first oxide film 16 serve as implantation masks, and the phosphorous ions are implanted into a region where the CG silicon films 14, 14a and the p-Si film 15 are exposed so that a silicon film 17 containing a high concentration of phosphorous is formed. This phosphorous is used as a gettering element for removing nickel Ni, which is the introduced catalyst metal element. Subsequently, by heating under conditions of 600° C. for 24 hours, the nickel Ni element in a region covered with the first oxide film 16 in the CG silicon film 14 and the p-Si film 15 is gettered into the silicon film 17 containing a high concentration of phosphorous. At this time, the temperature is preferably in the range of 500–800° C. The higher temperature leads to a higher gettering effect. At this time, the p-Si film 15, to which nickel Ni is not added intentionally, is also provided with a gettering region to getter nickel Ni. This is to prevent the nickel Ni element from being introduced from the CG silicon film 14, to which nickel Ni is added, into the p-Si film 15, by diffusion.

(1-5) FIG. 1E

Subsequently, the whole surface of the CG silicon film 17 containing a high concentration of phosphorous (shown in FIG. 1D) is removed by dry etching. Further, the whole surfaces of the protection film 13 (shown in FIG. 1D) and the first oxide film 16 (shown in FIG. 1D) are removed by using a buffered hydrofluoric acid. The remaining CG silicon film 14 and p-Si film 15 contain little nickel Ni element due to a gettering effect of the CG silicon film 17 containing a high concentration of phosphorous. Subsequently, the CG silicon film 14 and the p-Si film 15 are heated in an O$_2$ atmosphere at 950° C. to form a second oxide film 18 on the surfaces of the CG silicon film 14 and the p-Si film 15a. This process is called a second gettering, and has an effect of further removing the metal element (Ni) reduced by the aforementioned gettering. This second gettering has a higher gettering effect when the heat treatment is performed in an oxidative atmosphere containing at least one kind of halogen element out of HCl, HF, HBr, Cl$_2$, F$_2$, Br$_2$ and so on. The temperature range in the second gettering is preferably 900–1150° C., and the higher temperature leads to a higher gettering effect since diffusion of the metal element is promoted in the second oxide film 18.

(1-6) FIG. 2A

Subsequently, after the second oxide film 18 (shown in FIG. 1E) is removed by using a buffered hydrofluoric acid, patterning is performed by general photolithography and dry etching to form a CG silicon film 14b for a peripheral drive circuit and a p-Si film 15b for a display unit. A third oxide film 19 having a thickness of 80 nm as a gate insulating film is formed on these patterned CG silicon film 14b for a peripheral drive circuit and p-Si film 15b for a display unit by the CVD method. Then, a p-Si film is further deposited 300 nm by the CVD method, and the p-Si film is patterned by general photolithography and dry etching to form gate electrodes 20 above central portions of the CG silicon film 14b for a peripheral drive circuit and the p-Si film 15b for a display unit. The portion of the CG silicon film 14b for a peripheral drive circuit and the p-Si film 15b for a display unit below these gate electrodes 20 become TFT active regions 14c, 15c (shown in FIG. 2B).

(1-7) FIG. 2B

Subsequently, about $2 \times 10^{15}$ atoms/cm$^2$ of phosphorous ions are implanted into the CG silicon film 14b and the p-Si film 15b for a display unit by using the gate electrodes 20 as masks to form source regions 21a, drain regions 21b and TFT active regions 14c, 15c. A fourth oxide film 22 as an interlayer insulating film is formed 600 nm on the whole surfaces of the third oxide film 19 and the gate electrodes 20 by the CVD method. Then, heat treatment is performed in a nitrogen atmosphere at 950° C. for 30 minutes to activate phosphorous ions implanted in the source regions 21a and the drain regions 21b. Subsequently, source contact holes 27 and drain contact holes 28 are formed in the third and the fourth oxide film 19, 22 on the source regions 21a and the drain regions 21b by general photolithography and dry etching.

(1-8) FIG. 2C

Finally, AlSi having a thickness of 400 nm, a nitride film having a thickness of 400 nm and a transparent conductive film (ITO) having a thickness of 80 nm are successively deposited and subjected to photolithography and dry etching, which are repeated. Then, there are formed source wiring 23 which is made of AlSi and brought into contact with the source region 21a by the source contact hole 27, a drain electrode 24 which is made of AlSi and brought into contact with the drain region 21b by the drain contact hole 28, an interlayer film 25 made of a nitride film, a pixel contact hole 29 penetrating through the interlayer film 25 on the drain electrode 24 and a pixel electrode 26 made of a transparent conductive film.

Thus, a driver monolithic type active matrix circuit can be manufactured by the method of manufacturing a semiconductor device shown in the above (1-1) to (1-8).

Since, in the driver monolithic type active matrix circuit of the first embodiment, a CG silicon film is used as a TFT active region 14c for a peripheral drive circuit, a high ON current operation is enabled, while a low OFF current operation is enabled since a p-Si film is used as a TFT active region 15c for a pixel. Therefore, a driver monolithic type liquid crystal display device with high intensity, high precision and uniform characteristics can be achieved.

Second Embodiment

FIGS. 3 and 4 show processes of manufacturing a driver monolithic type active matrix circuit as a semiconductor device according to a second embodiment of the invention. The manufacturing process proceeds from FIGS. 3A–3E to FIGS. 4A–4E successively. In FIGS. 3 and 4, a peripheral drive circuit is shown on the left side and a matrix circuit of a display unit is shown on the right side. For simplification, only an N-MOS transistor is shown as the peripheral drive circuit, and a P-MOS transistor is not shown since this can be easily inferred.

(2-1) FIG. 3A

First, an a-Si film 32 is deposited 70 nm on a quartz substrate 31 by the plasma CVD method or the LPCVD method. A protection film 33 made of a $SiO_2$ film is laminated 100 nm by the atmospheric CVD method or the like. Then, the protection film 33 is patterned by general photolithography and wet etching to expose a part of the a-Si film 32. At this time, the protection film 33 is patterned so that a region to be used as a peripheral drive circuit is within a region where the a-Si film 32 is exposed and that a region to be used as a matrix circuit of a display unit is within a region protected by the protection film 33.

(2-2) FIG. 3B

Subsequently, the whole surface of the a-Si film 32 (shown in FIG. 3A) and the protection film 33 is coated with an aqueous solution in which 10 ppm of nickel acetate $Ni(CH_3COOH)_2$ is dissolved by spinning to add nickel Ni as a catalyst metal element for promoting crystallization of silicon Si. The nickel Ni concentration in the a-Si film 32 surface is set to be about $3\times10^{12}$ atoms/cm². Furthermore, sputtering, CVD, plasma treatment, vapor deposition or the like can also be employed as a method of adding the nickel Ni to the a-Si film 32 surface. Subsequently, heat treatment is performed in a nitrogen atmosphere to crystallize the a-Si film 32 and thereby form a CG silicon film 34. This heat treatment is preferably performed at temperature in the range of 500–700° C. Conditions of this embodiment are 600° C. for 12 hours. At this time, the a-Si film 32 under the protection film 33 becomes a p-Si film 35 due to its promoted crystallization by heat treatment at 600° C. for 12 hours. Furthermore, the CG silicon film also grows from a boundary between an exposed portion of the a-Si film 32 and the protection film 3 towards the inside of the a-Si film 32 under the protection film 33. The film in this portion is assumed as a CG silicon film 34a.

(2-3) FIG. 3C

Subsequently, a first oxide film 36 is laminated 200 nm on the CG silicon film 34 containing nickel Ni and the protection film 33 by the atmospheric CVD method or the like. At this time, the protection film 33 may be removed by etching before the first oxide film 36 is laminated. Then, the first oxide film 36 and the protection film 33 are patterned by general photolithography and wet etching to expose the CG silicon film 34, a part of the p-Si film 35 and CG silicon film 34a.

(2-4) FIG. 3D

Subsequently, about $2\times10^{15}$ atoms/cm² of phosphorous ions are implanted over the whole substrate. At this time, the protection film 33 and the first oxide film 36 serve as implantation masks, and the phosphorous ions are implanted into a region where the CG silicon films 34, 34a and the p-Si film 35 are exposed so that a silicon film 37 containing a high concentration of phosphorous is formed. This phosphorous is used as a gettering element for removing nickel Ni, which is the introduced catalyst metal element. Subsequently, by heating under conditions of 600° C. for 24 hours, the nickel Ni element in a region covered with the first oxide film 36 in the CG silicon film 34 and the p-Si film 35 is gettered into the silicon film 37 containing a high concentration of phosphorous. At this time, the temperature is preferably in the range of 500–800° C. The higher temperature leads to a higher gettering effect. At this time, the p-Si film 35, to which nickel Ni is not added intentionally, is also provided with a gettering region to getter nickel Ni. This is to prevent the nickel Ni element from being introduced from the CG silicon film 34, to which nickel Ni is added, into the p-Si film 35, by diffusion.

(2-5) FIG. 3E

Subsequently, the whole surface of the CG silicon film 37 containing a high concentration of phosphorous (shown in FIG. 2D) is removed by dry etching. Further, the whole surfaces of the protection film 33 (shown in FIG. 2D) and the first oxide film 36 (shown in FIG. 2D) are removed by using a buffered hydrofluoric acid. The remaining CG silicon film 34 and p-Si film 35 contain little nickel Ni element due to a gettering effect of the CG silicon film 37 containing a high concentration of phosphorous. Subsequently, the CG silicon film 34 and the p-Si film 35 are heated in an $O_2$ atmosphere at 950° C. to form a second oxide film 38 on the surfaces of the CG silicon film 34 and the p-Si film 35a. This process is called a second gettering, and has an effect of further removing the metal element (Ni) reduced by the aforementioned gettering. This second gettering has a higher gettering effect when the heat treatment is performed in an oxidative atmosphere containing at least one kind of halogen element out of HCl, HF, HBr, $Cl_2$, $F_2$, $Br_2$ and so on. The temperature range in the second gettering is preferably 900–1150° C., and the higher temperature leads to a higher gettering effect since diffusion of the metal element is promoted in the second oxide film 38.

(2-6) FIG. 4A

Subsequently, after the second oxide film 38 (shown in FIG. 3E) is removed by using a buffered hydrofluoric acid, patterning is performed by general photolithography and dry etching to form a CG silicon film 34b for a peripheral drive circuit and a p-Si film 35b for a display unit. A third oxide film 39 having a thickness of 80 nm as a gate insulating film is formed on these patterned CG silicon film 34b for a peripheral drive circuit and p-Si film 35b for a display unit by the CVD method. Then, a p-Si film is further deposited 300 nm by the CVD method, and the p-Si film is patterned by general photolithography and dry etching to form gate electrodes 40 above central portions of the CG silicon film 34b for a peripheral drive circuit and the p-Si film 35b for a display unit. The portion of the CG silicon film 34b for a peripheral drive circuit and the p-Si film 35b for a display unit below these gate electrodes 40 become TFT active regions 34c, 35c (shown in FIG. 4B).

(2-7) FIG. 4B

Subsequently, about $3\times10^{12}$ atoms/cm² of phosphorous ions are implanted into the CG silicon film 34b (Shown in FIG. 4A) and the p-Si film 35b (Shown in FIG. 4A) for a display unit by using the gate electrodes 40 as masks to form a low-concentration impurity region 41c and TFT active regions 34c, 35c.

(2-8) FIG. 4C

Subsequently, general photolithography is performed to cover a part of the low-concentration impurity region 41c adjacent to the TFT active region 35c and the gate electrode 40 on the TFT active region 35c with a resist 50. Subsequently, about $2\times10^{15}$ atoms/cm$^2$ of phosphorous ions are implanted into the low-concentration impurity region 41c (shown in FIG. 4B) except for the region covered with the resist 50 to form a source region 41a and a drain region 41b, which are high-concentration impurity regions. In the TFT thus formed, low-concentration impurity regions 41c are formed between the TFT active region 35c and the source region 41a and between the TFT active region 35c and the drain region 41b. This TFT structure is called an LDD structure and is effective in reduction of an OFF current of a TFT, particularly effective in a TFT for a display unit.

(2-9) FIG. 4D

Subsequently, after the resist 50 (shown in FIG. 4C) is removed, a fourth oxide film 42 as an interlayer insulating film having a thickness of 600 nm is formed over the whole surfaces of the third oxide film 39 and the gate electrode 40 by the CVD method. Then, to activate the phosphorous ions implanted in the source region 41a, drain region 41b and low-concentration impurity region 41c, heat treatment is performed in a nitrogen atmosphere at 950° C. for 30 minutes. Subsequently, source contact holes 47 and drain contact holes 48 are formed in the third and the fourth oxide film 39, 42 on the source regions 41a and the drain regions 41b by general photolithography and dry etching.

(2-10) FIG. 4E

Finally, AlSi having a thickness of 400 nm, a nitride film having a thickness of 400 nm and a transparent conductive film (ITO) having a thickness of 80 nm are successively deposited and subjected to photolithography and dry etching, which are repeated. Then, there are formed source wiring 43 which is made of AlSi and brought into contact with the source region 41a by the source contact hole 47, a drain electrode 44 which is made of AlSi and brought into contact with the drain region 41b by the drain contact hole 48, an interlayer film 45 made of a nitride film, a pixel contact hole 49 penetrating through the interlayer film 45 on the drain electrode 44 and a pixel electrode 46 made of a transparent conductive film.

Thus, a driver monolithic type active matrix circuit can be manufactured by the method of manufacturing a semiconductor device shown in the above (2-1) to (2-10).

The driver monolithic type active matrix circuit of the second embodiment has the same effect as that of the driver monolithic type active matrix circuit of the first embodiment. Since a TFT for a peripheral drive circuit and a TFT for a display unit have an LDD structure, effective in reduction of an OFF current in a TFT, particularly in a TFT for a display unit, wherein OFF characteristics are important.

Third Embodiment

FIGS. 5 and 6 show processes of manufacturing a driver monolithic type active matrix circuit as a semiconductor device according to a third embodiment of the invention. The manufacturing process proceeds from FIGS. 5A–5E to FIGS. 6A–6E successively. In FIGS. 5 and 6, a peripheral drive circuit is shown on the left side, and a matrix circuit of a display unit is shown on the right side. For simplification, only an N-MOS transistor of the peripheral drive circuit is shown, and a P-MOS transistor is not shown since it is easily inferred.

(3-1) FIG. 5A

First, an a-Si film 52 is deposited 70 nm on a quartz substrate 51 by the plasma CVD method or the LPCVD method. A protection film 53 made of a SiO$_2$ film is laminated 100 nm by the atmospheric CVD method or the like. Then, the protection film 53 is patterned by general photolithography and wet etching to expose a part of the a-Si film 52. At this time, the protection film 53 is patterned so that a region to be used as a peripheral drive circuit is within a region where the a-Si film 52 is exposed and that a region to be used as a matrix circuit of a display unit is within a region protected by the protection film 53.

(3-2) FIG. 5B

Subsequently, the whole surface of the a-Si film 52 (shown in FIG. 5A) and the protection film 53 is coated with an aqueous solution in which 10 ppm of nickel acetate Ni(CH$_3$COOH)$_2$ is dissolved by spinning to add nickel Ni as a catalyst metal element for promoting crystallization of silicon Si. The nickel Ni concentration in the a-Si film 52 surface is set to be about $3\times10^{12}$ atoms/cm$^2$. Furthermore, sputtering, CVD, plasma treatment, vapor deposition or the like can also be employed as a method of adding the nickel Ni to the a-Si film 52 surface. Subsequently, heat treatment is performed in a nitrogen atmosphere to crystallize the a-Si film 52 and thereby form a CG silicon film 54. This heat treatment is preferably performed at temperature in the range of 500–700° C. Conditions of this embodiment are 600° C. for 12 hours. At this time, the a-Si film 52 under the protection film 53 becomes a p-Si film 55 due to its promoted crystallization by heat treatment at 600° C. for 12 hours. Furthermore, at this time, the CG silicon film also grows from a boundary between an exposed portion of the a-Si film 52 and the protection film 53 towards the inside of the a-Si film 52 under the protection film 53. The film in this portion is assumed as a CG silicon film 54a.

(3-3) FIG. 5C

Subsequently, a first oxide film 56 is laminated 200 nm on the CG silicon film 54 containing nickel Ni and the protection film 53 by the atmospheric CVD method or the like. At this time, the protection film 53 may be removed by etching before the first oxide film 56 is laminated. Then, the first oxide film 56 and the protection film 53 are patterned by general photolithography and wet etching to expose the CG silicon film 54, a part of the p-Si film 55 and CG silicon film 54a.

(3-4) FIG. 5D

Subsequently, about $2\times10^{15}$ atoms/cm$^2$ of phosphorous ions are implanted over the whole substrate. At this time, the protection film 53 and the first oxide film 56 serve as implantation masks, and the phosphorous ions are implanted into a region where the CG silicon films 54, 54a and the p-Si film 55 are exposed so that a silicon film 57 containing a high concentration of phosphorous is formed. This phosphorous is used as a gettering element for removing nickel Ni, which is the introduced catalyst metal element. Subsequently, by heating under conditions of 600° C. for 24 hours, the nickel Ni element in a region covered with the first oxide film 56 in the CG silicon film 54 and the p-Si film 55 is gettered into the silicon film 57 containing a high concentration of phosphorous. At this time, the temperature is preferably in the range of 500–800° C. The higher temperature leads to a higher gettering effect. At this time, the p-Si film 55, to which nickel Ni is not added intentionally, is also provided with a gettering region to getter nickel Ni. This is to prevent the nickel Ni element from being introduced from the CG silicon film 54, to which nickel Ni is added, into the p-Si film 55, by diffusion.

(3-5) FIG. 5E

Subsequently, the whole surface of the CG silicon film 57 containing a high concentration of phosphorous (shown in FIG. 5D) is removed by dry etching. Further, the whole surfaces of the protection film 53 (shown in FIG. 5D) and the first oxide film 56 (shown in FIG. 5D) are removed by using a buffered hydrofluoric acid. The remaining CG silicon film 54 and p-Si film 55 contain little nickel Ni element due to a gettering effect of the CG silicon film 57 containing a high concentration of phosphorous. Subsequently, the CG silicon film 54 and the p-Si film 55 are heated in an $O_2$ atmosphere at 950° C. to form a second oxide film 58 on the surfaces of the CG silicon film 54 and the p-Si film 55a. This process is called a second gettering, and has an effect of further removing the metal element (Ni) reduced by the aforementioned gettering. This second gettering has a higher gettering effect when the heat treatment is performed in an oxidative atmosphere containing at least one kind of halogen element out of HCl, HF, HBr, $Cl_2$, $F_2$, $Br_2$ and so on. The temperature range in the second gettering is preferably 900–1150° C., and the higher temperature leads to a higher gettering effect since diffusion of the metal element is promoted in the second oxide film 58.

(3-6) FIG. 6A

Subsequently, after the second oxide film 58 (shown in FIG. 5E) is removed by using a buffered hydrofluoric acid, patterning is performed by general photolithography and dry etching to form a CG silicon film 54b for a peripheral drive circuit and a p-Si film 55b for a display unit. A third oxide film 59 having a thickness of 80 nm as a gate insulating film is formed on these patterned CG silicon film 54b for a peripheral drive circuit and p-Si film 55b for a display unit by the CVD method. Then, a p-Si film is further deposited 300 nm by the CVD method, and the p-Si film is patterned by general photolithography and dry etching to form gate electrodes 60 above central portions of the CG silicon film 54b for a peripheral drive circuit and the p-Si film 55b for a display unit. The portion of the CG silicon film 14b for a peripheral drive circuit and the p-Si film 15b for a display unit below these gate electrodes 20 become TFT active regions 54c, 55c. At this time, the p-Si film 55b for a display unit is provided with two gate electrodes 60. This is called a dual gate structure, and stabilizes TFT characteristics, thereby improving uniformity of characteristics of a TFT for a display unit. The portions of the CG silicon film 54b for a peripheral drive circuit and the p-Si film 55b for a display unit, which are disposed under these gate electrodes 60, become TFT active regions 54c, 55c later (shown in FIG. 6B).

(3-7) FIG. 6B

Subsequently, about $3 \times 10^{12}$ atoms/cm² of phosphorous ions are implanted into the CG silicon film 54b (Shown in FIG. 6A) and the p-Si film 55b (Shown in FIG. 6A) for a display unit by using the gate electrodes 60 as masks to form a low-concentration impurity region 61c and TFT active regions 54c, 55c.

(3-8) FIG. 6C

Subsequently, general photolithography is performed to cover a part of the low-concentration impurity region 61c adjacent to the TFT active region 55c and the gate electrode 60 on the TFT active region 55c with a resist 70. Subsequently, about $2 \times 10^{15}$ atoms/cm² of phosphorous ions are implanted into the low-concentration impurity region 61c (shown in FIG. 6B) except for the region covered with the resist 70 to form a source region 61a and a drain region 61b, which are high-concentration impurity regions. In the TFT thus formed, low-concentration impurity regions 61c are formed between the TFT active region 55c and the source region 61a and between the TFT active region 55c and the drain region 61b.

(3-9) FIG. 6D

Subsequently, after the resist 70 (shown in FIG. 6C) is removed, a fourth oxide film 62 as an interlayer insulating film having a thickness of 600 nm is formed over the whole surfaces of the third oxide film 59 and the gate electrode 60 by the CVD method. Then, to activate the phosphorous ions implanted in the source region 61a, drain region 61b and low-concentration impurity region 61c, heat treatment is performed in a nitrogen atmosphere at 950° C. for 30 minutes. Subsequently, source contact holes 67 and drain contact holes 68 are formed in the third and the fourth oxide film 59, 62 on the source regions 61a and the drain regions 61b by general photolithography and dry etching.

(3-10) FIG. 6E

Finally, AlSi having a thickness of 400 nm, a nitride film having a thickness of 400 nm and a transparent conductive film (ITO) having a thickness of 80 nm are successively deposited and subjected to photolithography and dry etching, which are repeated. Then, there are formed source wiring 63 which is made of AlSi and brought into contact with the source region 61a by the source contact hole 67, a drain electrode 64 which is made of AlSi and brought into contact with the drain region 61b by the drain contact hole 68, an interlayer film 65 made of a nitride film, a pixel contact hole 69 penetrating through the interlayer film 65 on the drain electrode 64 and a pixel electrode 66 made of a transparent conductive film.

Thus, a driver monolithic type active matrix circuit can be manufactured by the method of manufacturing a semiconductor device shown in the above (3-1) to (3-10).

The driver monolithic type active matrix circuit of the third embodiment has the same effect as that of the driver monolithic type active matrix circuit of the second embodiment, and can uniform and stabilize transistor characteristics by forming the TFT for a display unit in a dual LDD structure.

Fourth Embodiment

Figure 7:
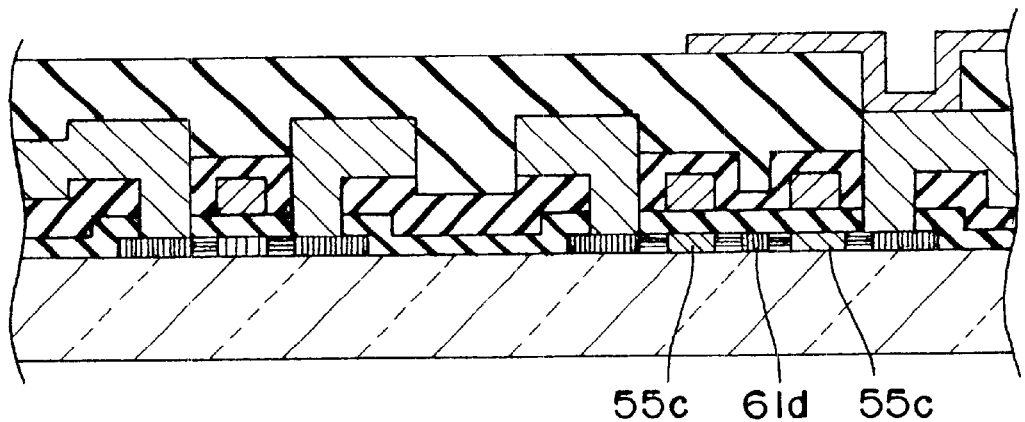
FIG. 7 is a cross sectional view showing a process of manufacturing a driver monolithic type active matrix circuit as a semiconductor device according to a fourth embodiment of the invention.

FIG. 7 shows processes of manufacturing a driver monolithic type active matrix circuit as a semiconductor device according to a fourth embodiment of the invention. In FIGS. 7, a peripheral drive circuit is shown on the left side, and a matrix circuit of a display unit is shown on the right side. For simplification, only an N-MOS transistor of the peripheral drive circuit is shown, and a P-MOS transistor is not shown since it is easily inferred.

Since this fourth embodiment is formed through almost the same processes as those of the third embodiment, drawings of those processes are omitted and only a cross sectional view showing a process where a final TFT is formed.

This fourth embodiment is a driver monolithic type active matrix circuit manufactured by implanting a high concentration of phosphorous ions without covering a part of a low-concentration impurity region 61c sandwiched between the TFT active regions 55c with a resist to form a high-concentration impurity region 61d in a part of the region sandwiched between the TFT active regions 55c in the process (3-8) of the third embodiment.

The driver monolithic type active matrix circuit of the fourth embodiment has the same effect as that of the driver monolithic type active matrix circuit of the third embodiment.

Fifth Embodiment

Figure 8:
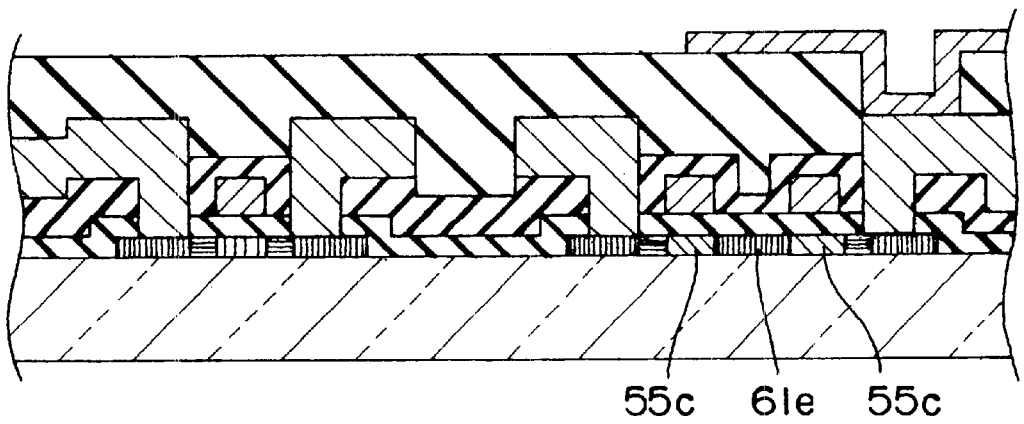
FIG. 8 is a cross sectional view showing a process of manufacturing a driver monolithic type active matrix circuit as a semiconductor device according to a fifth embodiment of the invention.
Figure 9A:
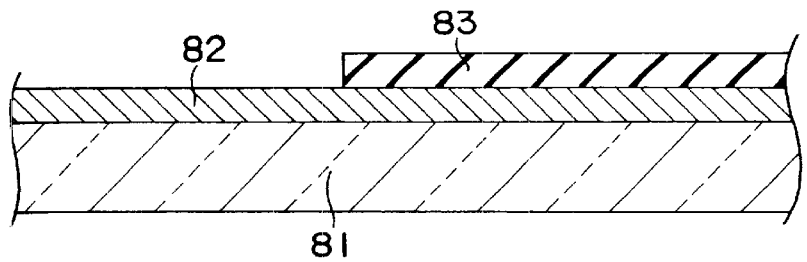
FIGS. 9A–9E are cross sectional views showing processes of manufacturing a driver monolithic type active matrix circuit as a semiconductor device according to a sixth embodiment of the invention.
Figure 9B:
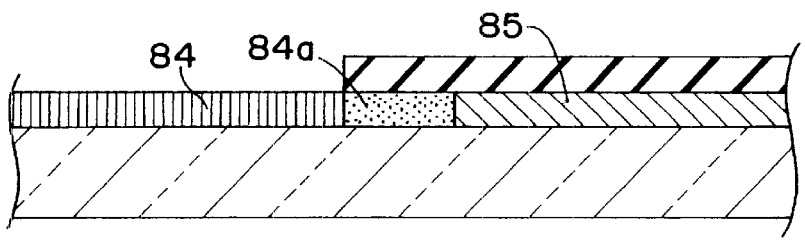
Figure 9C:
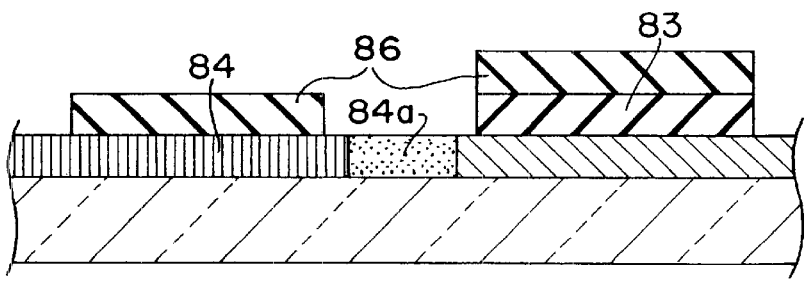
Figure 9D:
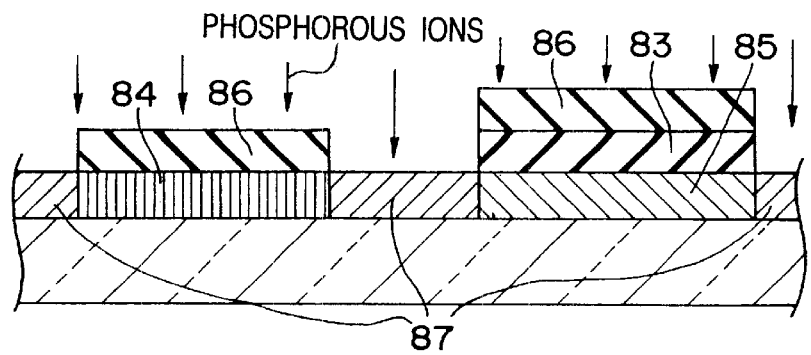
Figure 9E:
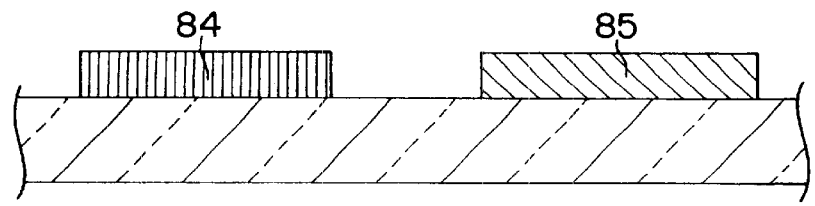
Figure 10A:
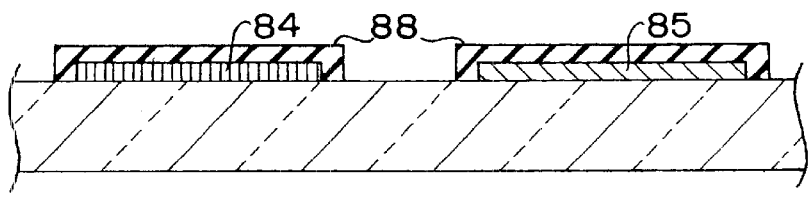
FIGS. 10A–10D are cross sectional views showing processes of manufacturing the driver monolithic type active matrix circuit following FIGS. 9A–9E.
Figure 10B:
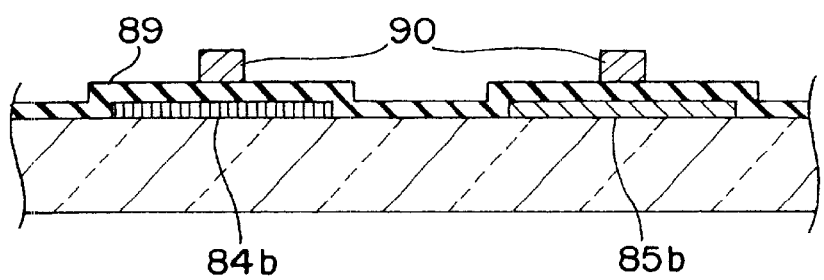
Figure 10C:
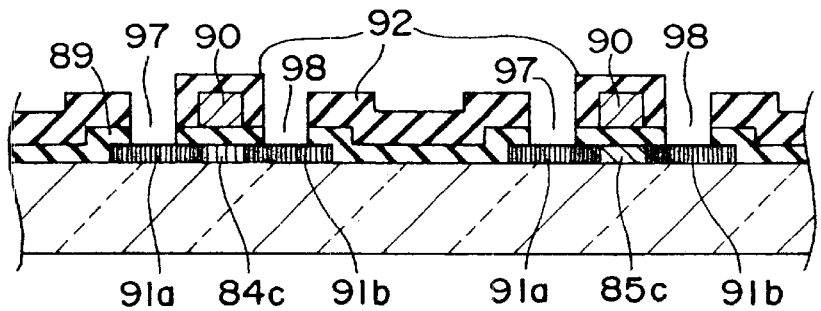
Figure 10D:
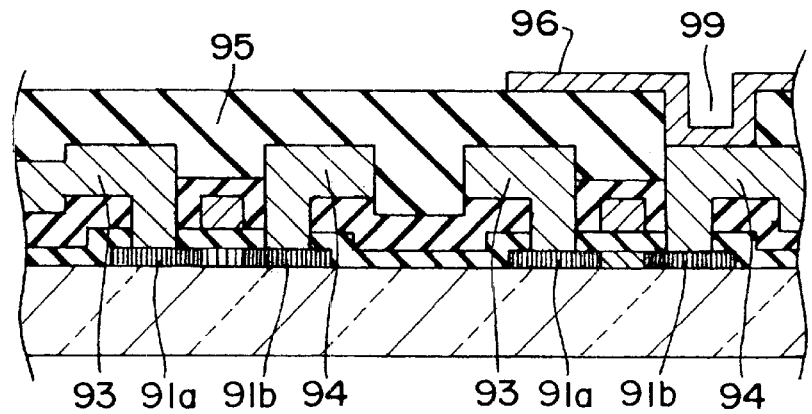
Figure 11A:
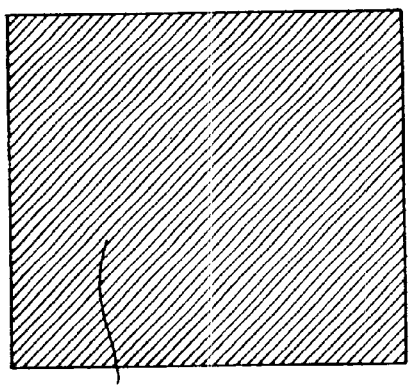
FIGS. 11A–11D are plan views for explaining growth of a CG silicon film.
Figure 11B:
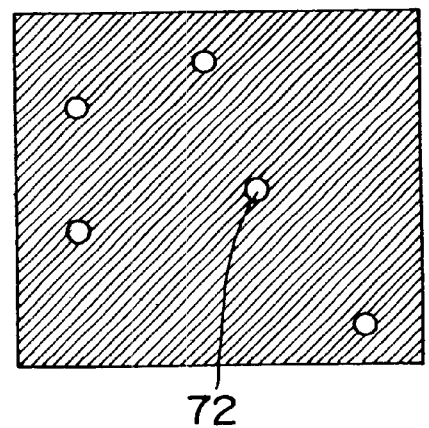
Figure 11C:
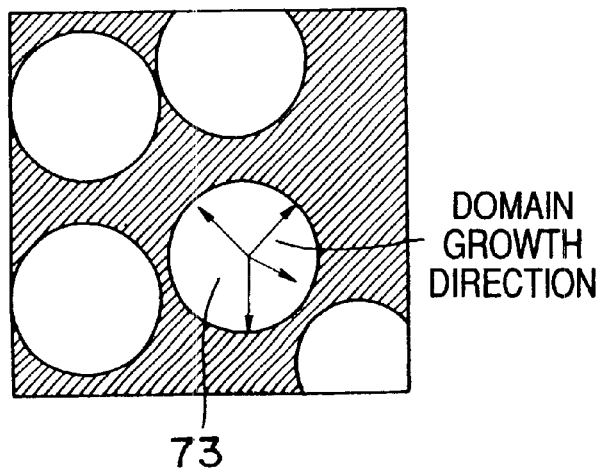
Figure 11D:
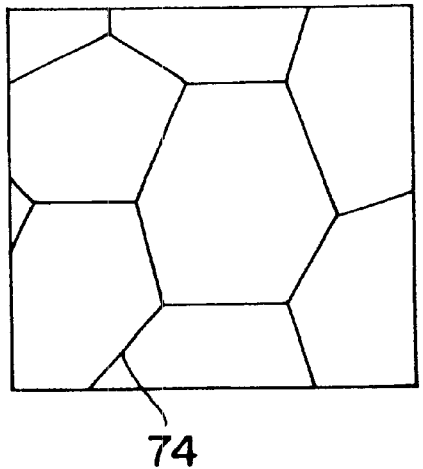
Figure 12:
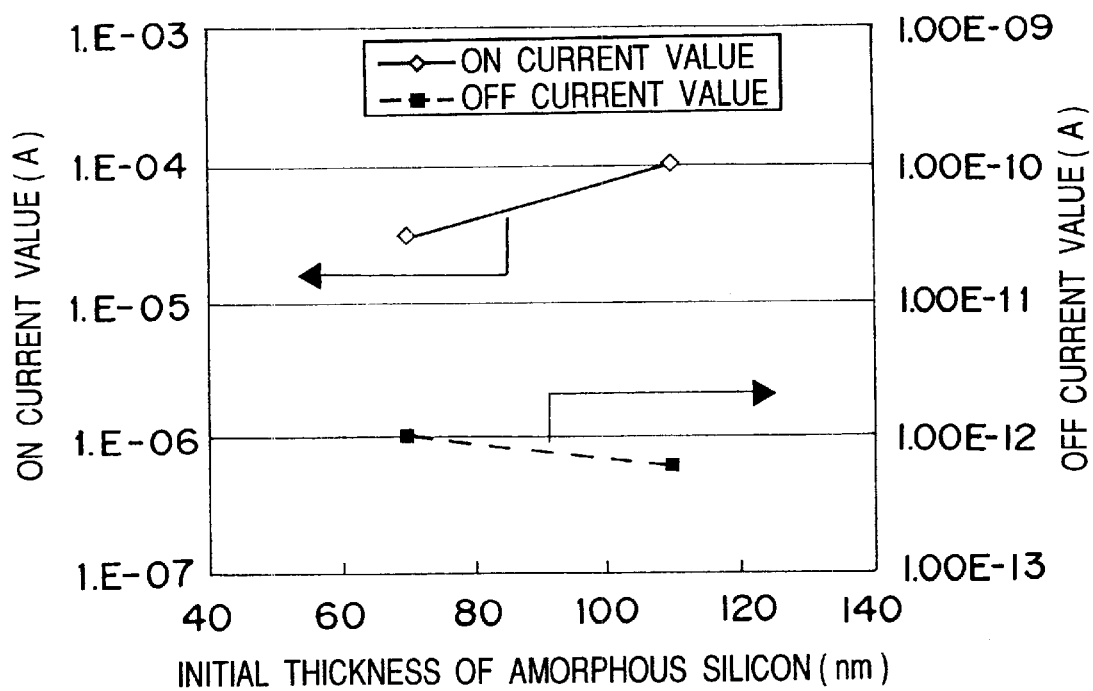
FIG. 12 is a graph showing thicknesses of the initial amorphous silicon film and TFT current characteristics.

FIG. 8 shows processes of manufacturing a driver monolithic type active matrix circuit as a semiconductor device according to a fifth embodiment of the invention. In FIG. 8, a peripheral drive circuit is shown on the left side, and a matrix circuit of a display unit is shown on the right side. For simplification, only an N-MOS transistor of the peripheral drive circuit is shown, and a P-MOS transistor is not shown since it is easily inferred.

Since this fifth embodiment is formed through almost the same processes as those of the third embodiment, drawings of those processes are omitted and only a cross sectional view showing a process where a final TFT is formed.

This fifth embodiment is a driver monolithic type active matrix circuit manufactured by implanting a high concentration of phosphorous ions without covering the whole low-concentration impurity region 61c sandwiched between the TFT active regions 55c with a resist to form a high-concentration impurity region 61e in the region sandwiched between the TFT active regions 55c in the process (3-8) of the third embodiment.

The driver monolithic type active matrix circuit of the fifth embodiment has the same effect as that of the driver monolithic type active matrix circuit of the third embodiment.

Sixth Embodiment

FIGS. 9 and 10 show processes of manufacturing a driver monolithic type active matrix circuit as a semiconductor device according to a sixth embodiment of the invention. The manufacturing process proceeds from FIGS. 9A–9E to FIGS. 10A–10E successively. In FIGS. 9 and 10, a peripheral drive circuit is shown on the left side, and a matrix circuit of a display unit is shown on the right side. For simplification, only an N-MOS transistor of the peripheral drive circuit is shown, and a P-MOS transistor is not shown since it is easily inferred.

(4-1) FIG. 9A

First, an amorphous silicon film a-Si film 82 is deposited 70 nm on a quartz substrate 81 by the plasma CVD method or the LPCVD method. A protection film 83 made of a $SiO_2$ film is laminated 100 nm by the atmospheric CVD method or the like. Then, the protection film 83 is patterned by general photolithography and wet etching to expose a part of the a-Si film 82. At this time, the protection film 83 is patterned so that a region to be used as a peripheral drive circuit is within a region where the a-Si film 82 is exposed and that a region to be used as a matrix circuit of a display unit is within a region protected by the protection film 83.

(4-2) FIG. 9B

Subsequently, the whole surface of the a-Si film 82 (shown in FIG. 9A) and the protection film 83 is coated with an aqueous solution in which 10 ppm of nickel acetate $Ni(CH_3COOH)_2$ is dissolved by spinning to add nickel Ni as a catalyst metal element for promoting crystallization of silicon Si. The nickel Ni concentration in the a-Si film 82 surface is set to be about $3 \times 10^{12}$ atoms/cm$^2$. Furthermore, sputtering, CVD, plasma treatment, vapor deposition or the like can also be employed as a method of adding the nickel Ni to the a-Si film 82 surface. Subsequently, heat treatment is performed in a nitrogen atmosphere to crystallize the a-Si film 82 and thereby form a CG silicon film 84. This heat treatment is preferably performed at temperature in the range of 500–700° C. Conditions of this embodiment are 600° C. for 12 hours. At this time, the a-Si film 82 under the protection film 83 does not become a CG silicon film since the catalyst metal is not added thereto. However, crystallization of silicon Si is promoted by heat treatment at 600° C. for 12 hours, and the a-Si film 82 under the protection film 83 becomes a p-Si film 85. Furthermore, the CG silicon film also grows from a boundary between an exposed portion of the a-Si film 82 and the protection film 83 towards the inside of the a-Si film 82 under the protection film 83. This growth distance is about 100 μm from the boundary between the exposed portion of the a-Si film 82 and the protection film 83 to the p-Si film 85 side. The film in this portion is assumed as a CG silicon film 84a. This CG silicon film 84a is not used for active regions of a TFT for a peripheral drive circuit and a TFT for a display unit. Therefore, it is designed in advance such that a TFT is not formed in a region of the CG silicon film 84a, and hence the active regions of a TFT for a peripheral drive circuit and a TFT for a display unit are inevitably distant from each other by 100 μm or more.

(4-3) FIG. 9C

Subsequently, a first oxide film 86 is laminated 200 nm on the CG silicon film 84 containing nickel Ni and the protection film 83 by the atmospheric CVD method or the like. At this time, the protection film 83 may be removed by etching before the first oxide film 86 is laminated. Then, the first oxide film 86 and the protection film 83 are patterned by general photolithography and wet etching to expose the CG silicon film 84, a part of the p-Si film 85 and CG silicon film 84a.

(4-4) FIG. 9D

Subsequently, about $2 \times 10^{15}$ atoms/cm$^2$ of phosphorous ions are implanted over the whole substrate. At this time, the protection film 83 and the first oxide film 86 serve as implantation masks, and the phosphorous ions are implanted into a region where the CG silicon films 84, 84a and the p-Si film 85 are exposed so that a silicon film 87 containing a high concentration of phosphorous is formed. This phosphorous is used as a gettering element for removing nickel Ni, which is the introduced catalyst metal element. Subsequently, by heating under conditions of 600° C. for 24 hours, the nickel Ni element in a region covered with the first oxide film 86 in the CG silicon film 84 and the p-Si film 85 is gettered into the silicon film 87 containing a high concentration of phosphorous. At this time, the temperature is preferably in the range of 500–800° C. The higher temperature leads to a higher gettering effect. At this time, the p-Si film 85, to which nickel Ni is not added intentionally, is also provided with a gettering region to getter nickel Ni. This is to prevent the nickel Ni element from being introduced from the CG silicon film 84, to which nickel Ni is added, into the p-Si film 85, by diffusion.

(4-5) FIG. 9E

Subsequently, the whole surface of the CG silicon film 87 containing a high concentration of phosphorous (shown in FIG. 9D) is removed by dry etching. Further, the whole surfaces of the protection film 83 (shown in FIG. 9D) and the first oxide film 86 (shown in FIG. 9D) are removed by using a buffered hydrofluoric acid. The remaining CG silicon film 84 and p-Si film 85 contain little nickel Ni element due to a gettering effect of the CG silicon film 87 containing a high concentration of phosphorous.

(4-6) FIG. 10A

Subsequently, the CG silicon film 84 and the p-Si film 85 are reduced by dry etching, and then further heated at 950° C. in an $O_2$ atmosphere so that a second oxide film 88 is formed on the surfaces of the CG silicon film 84 and the p-Si film 85a, by which the CG silicon film 84 and the p-Si film 85 are further reduced. Finally, the CG silicon film 84 and the p-Si film 85 are formed in thickness in the range of 20–60 nm. Desirably, due to the relationship of the source-drain contact resistance, drain contact resistance and OFF current, the CG silicon film 84 and the p-Si film 85 are formed in thickness in the range of 35–50 nm. This film reducing process is performed to improve TFT characteristics since a thinner TFT active region leads to a lower OFF current. Furthermore, the oxidation process in the $O_2$ atmosphere is called a second gettering and has an effect of further removing the metal element (Ni) reduced by the aforementioned gettering. This second gettering has a higher gettering effect when the heat treatment is performed in an oxidative atmosphere containing at least one kind of halogen element out of HCl, HF, HBr, $Cl_2$, $F_2$, $Br_2$ and so on. The temperature range in the second gettering is preferably 900–1150° C., and the higher temperature leads to a higher gettering effect since diffusion of the metal element is promoted in the second oxide film 88. The film reducing process is not limited to the above mentioned method and can be performed, e.g., only by the dray etching or only by the thermal oxidation.

(4-7) FIG. 10B

Subsequently, after the second oxide film 88 (shown in FIG. 10A) is removed by using a buffered hydrofluoric acid, patterning is performed by general photolithography and dry etching to form a CG silicon film 84b for a peripheral drive circuit and a p-Si film 85b for a display unit. A third oxide film 89 having a thickness of 80 nm as a gate insulating film is formed on these patterned CG silicon film 84b for a peripheral drive circuit and p-Si film 85b for a display unit by the CVD method. Then, a p-Si film is further deposited 300 nm by the CVD method, and the p-Si film is patterned by general photolithography and dry etching to form gate electrodes 90 above central portions of the CG silicon film 84b for a peripheral drive circuit and the p-Si film 85b for a display unit. The portion of the CG silicon film 84b for a peripheral drive circuit and the p-Si film 85b for a display unit below these gate electrodes 90 become TFT active regions 84c, 85c (shown in FIG. 10C).

(4-8) FIG. 10C

Subsequently, about $2\times10^{15}$ atoms/cm$^2$ of phosphorous ions are implanted into the CG silicon film 84b (Shown in FIG. 10B) and the p-Si film 85b for a display unit (shown in FIG. 10B) by using the gate electrodes 90 as masks to form source regions 91a, drain regions 91b and TFT active regions 84c, 85c. A fourth oxide film 92 as an interlayer insulating film is formed 600 nm on the whole surfaces of the third oxide film 89 and the gate electrodes 90 by the CVD method. Then, heat treatment is performed in a nitrogen atmosphere at 950° C. for 30 minutes to activate phosphorous ions implanted in the source regions 91a and the drain regions 91b. Subsequently, source contact holes 97 and drain contact holes 98 are formed in the third and the fourth oxide film 89, 92 on the source regions 91a and the drain regions 91b by general photolithography and dry etching.

(4-9) FIG. 10D

Finally, AlSi having a thickness of 400 nm, a nitride film having a thickness of 400 nm and a transparent conductive film (ITO) having a thickness of 80 nm are successively deposited and subjected to photolithography and dry etching, which are repeated. Then, there are formed source wiring 93 which is made of AlSi and brought into contact with the source region 91a by the source contact hole 97, a drain electrode 94 which is made of AlSi and brought into contact with the drain region 91b by the drain contact hole 98, an interlayer film 95 made of a nitride film, a pixel contact hole 99 penetrating through the interlayer film 95 on the drain electrode 94 and a pixel electrode 96 made of a transparent conductive film.

Thus, a driver monolithic type active matrix circuit can be manufactured by the method of manufacturing a semiconductor device shown in the above (4-1) to (4-9).

The driver monolithic type active matrix circuit of the sixth embodiment has the same effect as that of the driver monolithic type active matrix circuit of the first embodiment. Sufficient crystal growth can be obtained by forming the a-Si film 82 in thickness of 110 nm. Furthermore, ON and OFF characteristics of a TFT become more favorable when the thickness of the initial a-Si film 82 before the film thickness is reduced is larger.

Furthermore, the thickness of the TFT active regions 84c, 85c is reduced and the OFF current value becomes lower by reducing the thickness of the CG silicon film 84 and the p-Si film 85 by dry etching and oxidation, and thus a favorable TFT OFF characteristics can be obtained.

It is noted that the above first to sixth embodiments are examples of TFTs of a semiconductor device manufactured by the present invention, and material, film thickness, forming method and so forth thereof are not limited to those used therein.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device including a display unit having pixel electrodes arranged in a matrix and transistors for a pixel connected to the pixel electrodes and a peripheral drive circuit having a transistor for a peripheral drive circuit provided outside the display unit, wherein the transistor for a peripheral drive circuit has a first crystalline silicon film, which is to be a crystal grown active region formed by introducing a catalyst metal into an amorphous silicon film and heating the film;

the transistor for a pixel has a second crystalline silicon film, which is to be an active region, formed by crystallizing the amorphous silicon film without introducing the catalyst metal;

the concentration of the catalyst metal in the first crystalline silicon film is in the range of $1\times10^{13}$ atoms/cm$^3$ or higher and lower than $1\times10^{15}$ atoms/cm$^3$; and the concentration of the catalyst metal in the second crystalline silicon film is lower than the concentration of the catalyst metal in the first crystalline silicon film.

2. A semiconductor device manufacturing method of manufacturing the semiconductor device according to claim 1, wherein, the catalyst metal in the first crystalline silicon film is removed by gettering.

3. The semiconductor device according to claim 1, wherein, the transistor for a pixel has an active region, a pair of high-concentration impurity regions, which are to be source regions, and drain regions formed on both sides of the active region and a pair of low-concentration impurity region formed between the source region and the active region and between the drain region and the active region.

4. The semiconductor device according to claim 1, wherein, the transistor for a pixel has two active regions formed with a prescribed gap therebetween, a pair of high-concentration impurity regions to be used as a source region and a drain region formed on both sides of the two active regions, a pair of low-concentration impurity regions formed between the high-concentration impurity region to be used as the source region and one of the active regions adjacent to the high-concentration impurity region and between the high-concentration impurity region to be used as the drain region and the other active region adjacent to the high-concentration impurity region, and an impurity region formed in a region sandwiched between the two active regions.

5. The semiconductor device according to claim 4, wherein, the impurity region formed in the region sandwiched between the two active regions contains at least either one of:

an impurity region having the same concentration as that of the pair of high-concentration impurity regions, which are to be the source region and the drain region, or an impurity region having the same concentration as that of the pair of low-concentration impurity regions.

6. The semiconductor device according to claim 1, wherein the active region of the transistor for a peripheral drive circuit formed in the first crystalline silicon film and the active region of the transistor for a pixel formed in the second crystalline silicon film have a distance of at least 100 μm or longer therebetween.

* * * * *